(12) United States Patent
Hellberg

(10) Patent No.: US 10,554,176 B2
(45) Date of Patent: Feb. 4, 2020

(54) DISTRIBUTED POWER AMPLIFIERS

(71) Applicant: Telefonaktiebolaget LM Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/766,989

(22) PCT Filed: Oct. 27, 2015

(86) PCT No.: PCT/SE2015/051134
§ 371 (c)(1),
(2) Date: Apr. 9, 2018

(87) PCT Pub. No.: WO2017/074229
PCT Pub. Date: May 4, 2017

(65) Prior Publication Data
US 2018/0302040 A1    Oct. 18, 2018

(51) Int. Cl.
*H03F 3/68*    (2006.01)
*H03F 1/02*    (2006.01)
(Continued)

(52) U.S. Cl.
CPC ............ *H03F 1/0288* (2013.01); *H03F 3/19* (2013.01); *H03F 3/21* (2013.01); *H03F 2200/387* (2013.01); *H03F 2200/451* (2013.01)

(58) Field of Classification Search
CPC . H03F 1/0288; H03F 3/21; H03F 3/19; H03F 3/605; H03F 3/607;
(Continued)

(56) References Cited

U.S. PATENT DOCUMENTS

| 4,092,616 A | 5/1978 | Osterwalder |
| 4,752,746 A * | 6/1988 | Niclas ............... H03F 3/607 330/277 |

(Continued)

FOREIGN PATENT DOCUMENTS

| EP | 0802626 A1 | 10/1997 |
| JP | 2012511840 A | 5/2012 |

(Continued)

OTHER PUBLICATIONS

Giofre, R , et al., "A distributed matching/combining network suitable for Doherty power amplifiers covering more than an octave frequency band", E.E.Dept. University of Roma Tor Vergata, Roma, Italy, 2014, 3 pages.

(Continued)

*Primary Examiner* — Khanh V Nguyen
(74) *Attorney, Agent, or Firm* — Murphy, Bilak & Homiller, PLLC

(57) ABSTRACT

A power amplifier (100, 200, 500, 800, 1100) for amplifying an input signal into an output signal is disclosed. The power amplifier (100, 200, 500, 800, 1100) comprises an input port (110) for receiving the input signal and an output port (130) coupled to an output transmission line (140) for providing the output signal. The power amplifier (100, 200, 500, 800, 1100) further comprises multiple sets of sub-amplifiers (150, 160, 170, 180) distributed along the output transmission line, and inputs of the subamplifiers are coupled to the input port, outputs of the sub-amplifiers are coupled to the output transmission line. At least two different supply voltages are provided for the sub-amplifiers in the multiple sets of sub-amplifiers (150, 160, 170, 180).

19 Claims, 17 Drawing Sheets

(51) Int. Cl.
*H03F 3/19* (2006.01)
*H03F 3/21* (2006.01)

(58) Field of Classification Search
CPC ......... H03F 2200/451; H03F 2200/387; H03F 3/602; H03F 3/60; H03F 3/211; H03F 3/604; H03F 1/20; H03F 3/54; H04B 3/06
USPC .............................. 330/53, 54, 84, 286, 295
See application file for complete search history.

(56) References Cited

U.S. PATENT DOCUMENTS

| | | |
|---|---|---|
| 8,742,851 B2 | 6/2014 | Jahanian et al. |
| 2010/0052814 A1* | 3/2010 | Plaze ................. H03F 3/605 333/132 |
| 2013/0009707 A1 | 1/2013 | Kim et al. |
| 2013/0063213 A1* | 3/2013 | Kobayashi ......... H03F 3/189 330/291 |
| 2017/0117860 A1* | 4/2017 | Itabashi .............. H03F 1/48 |

FOREIGN PATENT DOCUMENTS

| | | |
|---|---|---|
| JP | 2012178821 A | 9/2012 |
| JP | 2012231392 A | 11/2012 |
| KR | 101332569 B1 | 11/2013 |
| WO | 2003061115 A1 | 7/2003 |
| WO | 2015057118 A1 | 4/2015 |
| WO | 2016056951 A1 | 4/2016 |
| WO | 2016056952 A1 | 4/2016 |
| WO | 2016182485 A1 | 11/2016 |

OTHER PUBLICATIONS

Gustafsson, David, et al., "A Novel Wideband and Reconfigurable High Average Efficiency Power Amplifier", Department of Microtechnology and Nanoscience, Chalmers University of Technology, Goteborg, Sweden, 2012, 3 pages.

Chireix, H, "High Power Outphasing Modulation", Proceedings of the Institute of Radio Engineers, vol. 23, Issue 11, Nov. 1935, pp. 1370-1392.

Doherty, W. H., "A New High Efficiency Power Amplifier for Modulated Waves", Proceedings of the Institute of Radio Engineers, vol. 24, No. 9, Sep. 1936, pp. 1163-1182.

Ginzton, Edward L. et al., "Distributed Amplification", Proceedings of the I.R.E, Aug. 1948, 956-969.

Gustafsson, David et al., "A 44 dBm 1.0-3.0 GHz GaN Power Amplifier with over 45% PAE at 6 dB back-off", 2013 IEEE MTT-S International Microwave Symposium Digest (IMS), Jun. 2-7, 2013, 1-4.

Gustafsson, David, "A Novel Wideband and Reconfigurable High Average Efficiency Power Amplifier", 2012 IEEE MTT-S International Microwave Symposium Digest (MTT), Jun. 17-22, 2012, 1-3.

Mok, Philip K., "Single-Inductor-Multiple-Output DC-DC Converter Design", IEEE Custom Integrated Circuits Conference 2013, Sep. 24, 2013, 1-70.

Naseri, Mehdi et al., "An Extended Bandwidth Doherty Power Amplifier Using a Novel Output Combiner", 2014 IEEE MTT-S International Microwave Symposium (IMS), Jun. 1-6, 2014, 1-4.

Piazzon, Luca et al., "A Method for Designing Broadband Doherty Power Amplifiers", Progress in Electromagnetics Research, vol. 145, Jan. 2014, 319-331.

* cited by examiner

DISTRIBUTED POWER AMPLIFIERS

TECHNICAL FIELD

Embodiments herein relate to distributed power amplifiers for amplification of an input signal into an output signal. In particular, power amplifiers comprising multiple sets of sub-amplifiers distributed along an output transmission line are disclosed. Furthermore, radio network nodes and user equipments in wireless communication systems, and electronic devices in general comprising the distributed power amplifier are disclosed.

BACKGROUND

Power amplifiers are widely used for example in radio base stations and user equipments in wireless communication systems. Power amplifiers typically amplify input signals of high frequencies into an output signal ready for radio transmission. High efficiency is generally desirable for power amplifier design to reduce the amount of power consumed. Moreover, in many applications, such as in a satellite or a cellular phone or user equipment, the amount of power is limited due to powering by a battery. An increase in efficiency of the power amplifier would allow an increase of operational time for these applications before recharging or replacing the battery is necessary.

A conventional Power Amplifier (PA), such as Class B, AB, F, has a fixed Radio Frequency (RF) load resistance and a fixed Direct Current (DC) voltage supply. The RF output current of a Class B or AB PA has a form similar to a pulse train with half wave rectified sinusoid current pulses. The DC current, and hence the DC power, is largely proportional to the RF output current amplitude since the DC supply voltage is constant. The output power, however, is proportional to the RF output current squared. An efficiency of the conventional power amplifier, i.e. output power divided by DC power, is therefore also proportional to the RF output current amplitude. While efficiency of an amplifier may be high at the highest output power, the average efficiency is low when amplifying input signals that on average have a low power or low signal amplitude compared to the maximum input signal amplitude.

Some modified Class B RF power amplifiers, such as Doherty type amplifier disclosed in "*A new high efficiency power amplifier for modulated waves,*" Proc. IRE, vol. 24, no. 9, pp. 1163-1182, Sep. 1936, and Chireix type power amplifier disclosed in "*High power outphasing modulation*", Proc. IRE, vol. 23, no. 2, pp. 1370-1392, Nov. 1935, are generally more efficient than the conventional amplifier described above for amplitude-modulated input signals with high Peak-to-Average Ratio (PAR). However Chireix and Doherty type amplifiers are inherently narrowband, since their operation depends on reactive circuits that are strongly frequency dependent.

Generally, RF power amplifier can be driven in a so called backed off operation. This means that the power amplifier is operated at a certain level, e.g. expressed as a number of decibels (dBs), under its maximum output power. Backed off operation may also refer to that an instantaneous output power is relatively low. When discussing operations of a power amplifier, the term "transition point" is generally used, which means that at a certain amplitude point, i.e. the transition point, some significant changes occur in the power amplifier, for example operating mode, number of active sub-amplifiers etc. In some amplifiers such as Doherty type, the transition points are also high-efficiency points in the efficiency plot.

Wideband Doherty type amplifiers are a subject of much interest, and many approaches have been attempted to increase the bandwidth and efficiency, which are unfortunately accompanied with some disadvantages or drawbacks.

For example, in a paper by D Gustafsson et al., entitled "*Theory and design of a novel wideband and reconfigurable high average efficiency amplifier*", published in Proc. IMS 2012, a quarter wavelength transmission line with the same impedance is used as the load which results in wideband efficiency at the transition point. However, the wideband efficiency at the transition point is obtained by sacrificing efficiency at maximum power and utilization of transistor, which reduces the bandwidth of high average efficiency as well as increases the transistor cost.

In patent application WO2003/061115, filed by the present Applicant, a wideband amplifier with 100% relative bandwidth, i.e. frequencies at the high band edge and low band edge having a ratio of 3:1, and with high efficiency at backed off operation is disclosed. The wideband amplifier disclosed here has different operating modes in different frequency bands and has a wide instantaneous bandwidth around the centre frequency. However, it is difficult to operate across the borders of the frequency bands between the different operating modes. Further the output signal amplitude at the transition point varies considerably within the bandwidth.

In a paper by M Naseri Ali Abadi et al., entitled "*An Extended Bandwidth Doherty Power Amplifier using a Novel Output Combiner*", published in Proc. IMS 2014, an LC-resonator is used at the output node. Using LC-resonator or using a resonant stub at the output node has the drawback of decreasing the output power bandwidth and efficiency bandwidth at full power.

In a paper by Piazzon et al., entitled "*A method for Designing Broadband Doherty Power Amplifiers*", published on Progress in Electromagnetics Research, Vol. 145, pp319-331, 2014, or in a paper by R Giofrè et al., entitled "*A Distributed Matching/Combining Network Suitable to Design Doherty Power Amplifiers Covering More Than an Octave Bandwidth*", published in Proc. IMS 2014, another technique involving the use of a multi-section branch line coupler is disclosed, which has limitation in the efficiency bandwidth both at the transition point and at full power, and also has limitation in the output power bandwidth at full power.

SUMMARY

An object of embodiments herein is to provide a power amplifier with improved performance in respect of bandwidth, efficiency and ripples on output signals.

According to an aspect, the object is achieved by a power amplifier for amplifying an input signal into an output signal. The power amplifier comprises an input port for receiving the input signal and an output port coupled to an output transmission line for providing the output signal. The power amplifier further comprises multiple sets of sub-amplifiers distributed along the output transmission line, and inputs of the sub-amplifiers are coupled to the input port, outputs of the sub-amplifiers are coupled to the output transmission line. At least two different supply voltages are provided for the sub-amplifiers in the multiple sets of sub-amplifiers.

According to the embodiments herein, the power amplifier comprises multiple sets of sub-amplifiers distributed along the output transmission line. The number of sets of sub-amplifiers corresponds to the number of efficiency peaks in backed off operation and the number of sub-amplifiers in each set has a relation to the bandwidth, ripples on the output signals and efficiency. Therefore, the number of sets and the number of sub-amplifiers in each set may be configured so that high efficiency over a wide range of input signal amplitudes and over a large relative bandwidth, and lower ripples on the output signals may be achieved.

Further, according to the embodiments herein at least two different supply voltages are provided for the sub-amplifiers in the multiple sets of sub-amplifiers, so the supply voltages to some sets or some sub-amplifiers may be depressed to accommodate only the local maximum output voltage swing at said sub-amplifiers. This will improve efficiency even more. Moreover, according to embodiments herein the sub-amplifiers are distributed along the output transmission line. The output transmission line may be configured to have different characteristic impedance for different sets of sub-amplifiers, for example, uniform transmission line may be used only for some distributed sets of sub-amplifiers, and interpolated and extrapolated with other type of transmission lines, such as tapered or stepwise transmission line etc. In this way, the RF output voltages and maximum output currents from the sub-amplifiers may be configured to minimize ripples on the output signals over a specified bandwidth by a proper combination of the supply voltages and the characteristic impedance of the output transmission line.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

Figure 1:
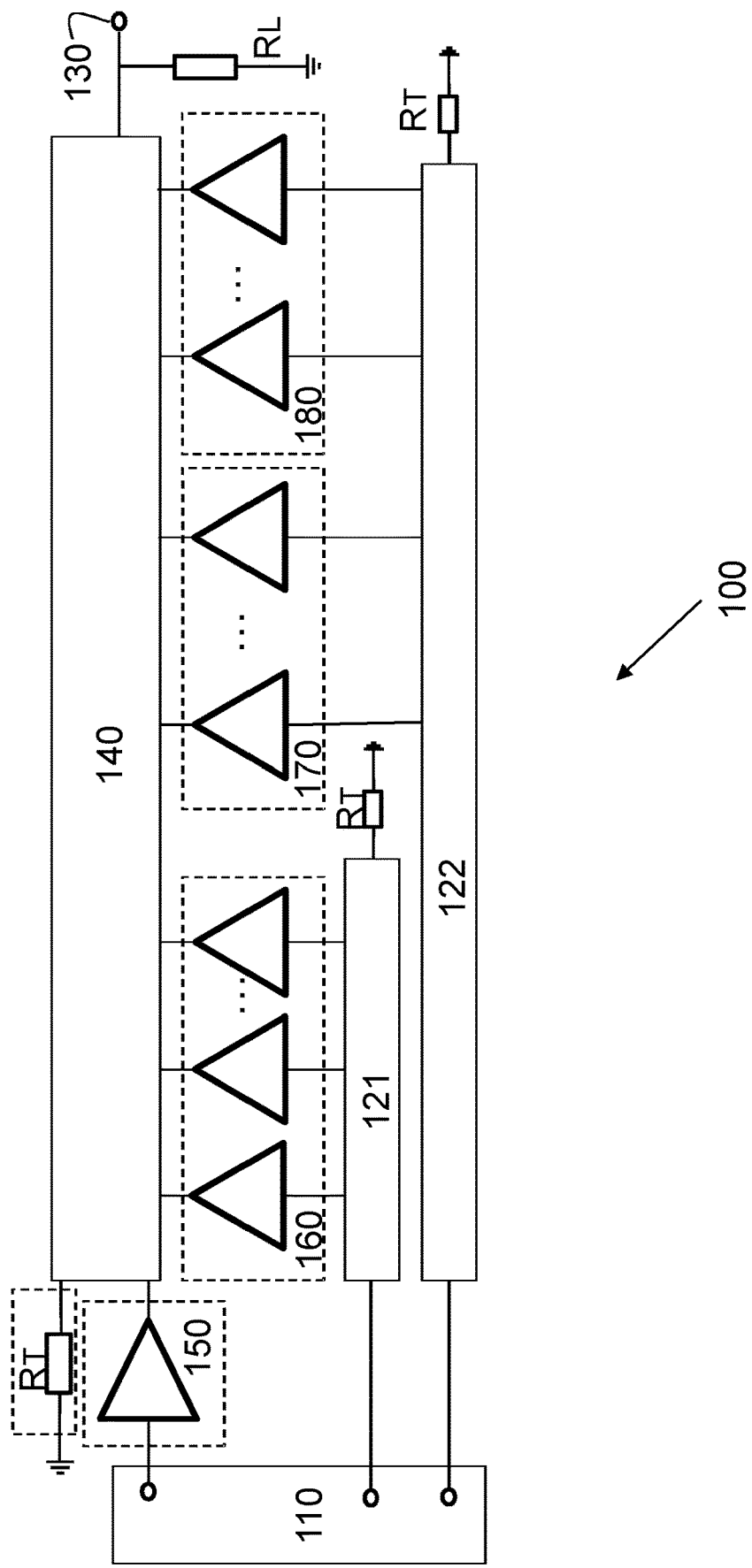
FIG. 1 is a schematic block diagram illustrating a general structure of a distributed power amplifier according to embodiments herein.

Throughout the following description similar reference numerals have been used to denote similar features, such as elements, units, modules, circuits, nodes, parts, items or the like, when applicable.

FIG. 1 illustrates a general structure of a power amplifier 100 for amplifying an input signal into an output signal. The power amplifier 100 comprises an input port 110 for receiving the input signal, and an output port 130 coupled, or connected, to an output transmission line 140 for providing the output signal.

The power amplifier 100 further comprises multiple sets of sub-amplifiers 150, 160, 170, 180 distributed along the output transmission line 140.

The inputs of the sub-amplifiers in each set are coupled, or connected, to the input port 110, either via an input transmission line 121, 122 or any other means (not shown). The outputs of the sub-amplifiers in each set are coupled to the output transmission line 140.

To maximize or improve the efficiency of the power amplifier 100, at least two different supply voltages are provided for the sub-amplifiers in the multiple sets of sub-amplifiers 150, 160, 170, 180.

Functions, features, advantages of the power amplifier 100 will be discussed in detail with reference to different examples and implementations which fall in the general structure of the power amplifier 100 as shown in FIG. 1.

Figure 2:
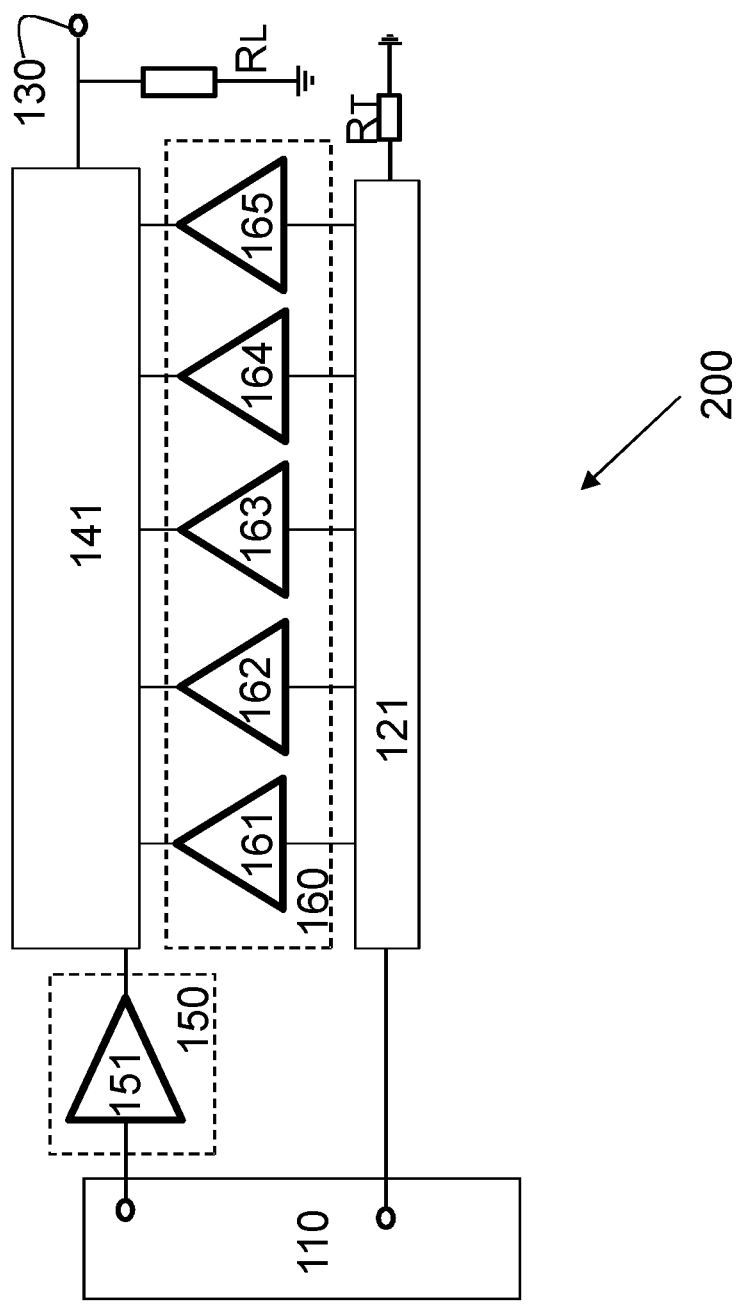
FIG. 2 is a schematic block diagram illustrating a first example of a distributed power amplifier according to embodiments herein.

FIG. 2 shows a first example of the power amplifier 100, now denoted as power amplifier 200. The power amplifier 200 comprises two sets of sub-amplifiers, a first set of sub-amplifiers 150 and a second set of sub-amplifiers 160. The first set of sub-amplifiers 150 comprises one single sub-amplifier 151 placed at the beginning of the output transmission line, denoted now as a first part of the output transmission line 141. The second set of sub-amplifiers 160 comprises at least two sub-amplifiers 161, 162 distributed along the first part of the output transmission line 141. The first part of the output transmission line 141 has uniform characteristic impedance and terminated in a load resistance $R_L$ of the same value. The load resistance $R_L$ may represent impedances of an antenna, transmission line, isolator or/and filter etc. coupled to the output port 130.

Figure 3:
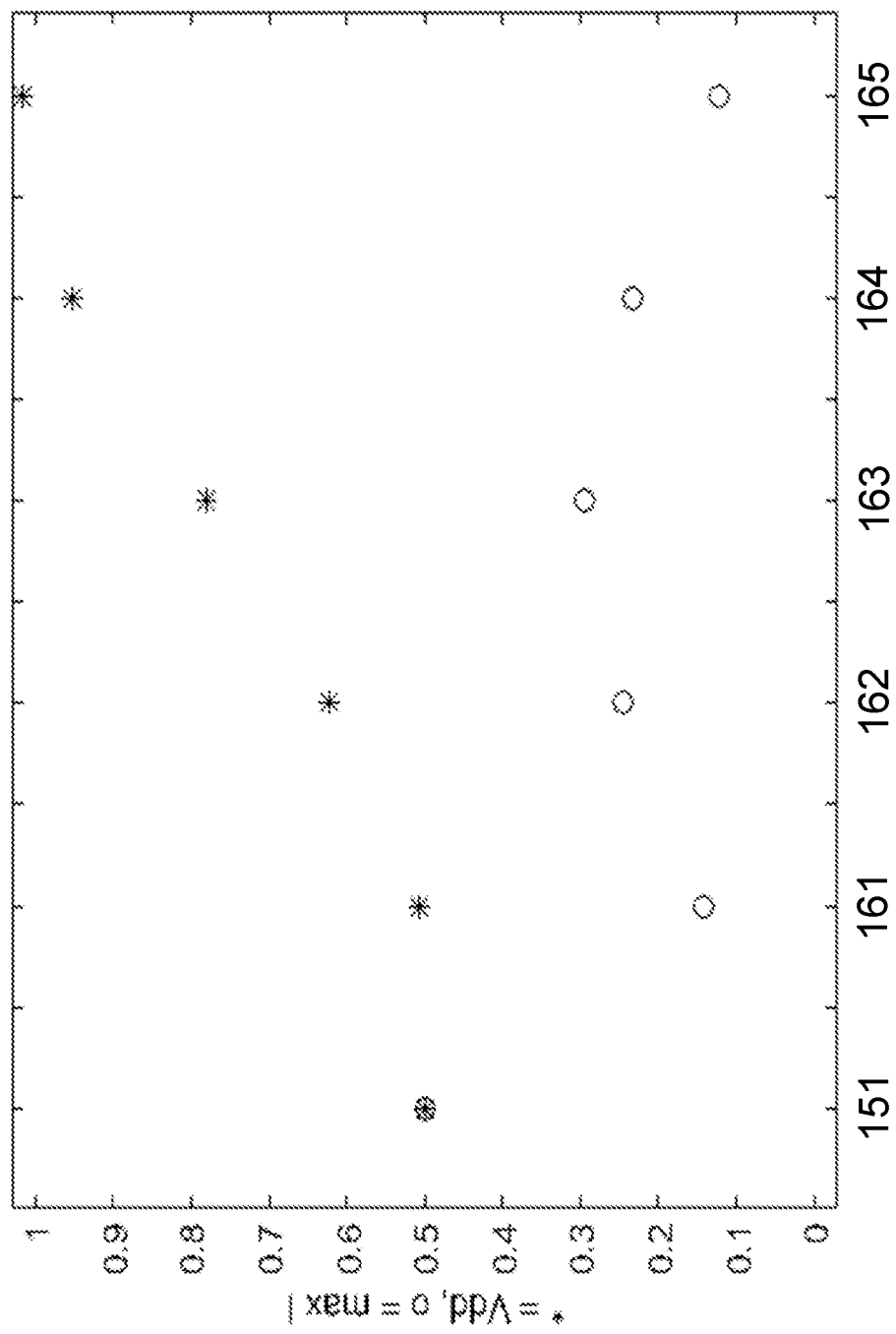
FIG. 3 is a diagram illustrating supply voltages and maximum output currents of the sub-amplifiers in the distributed power amplifier shown in FIG. 2.

Exemplary supply voltages and maximum RF output currents of the sub-amplifiers are shown in FIG. 3. The Y-axis represents supply voltage and maximum RF output current with relative values from 0 to 1, where a circle symbol represents the maximum RF output current and a star symbol represents the supply voltage, the X-axis represents the sub-amplifiers indicated by their reference numbers 151, 161-165 distributed along the output transmission line.

To maximize or improve the efficiency, the supply voltages to some sub-amplifiers are reduced compared to the normal maximum supply voltage or compared to supply voltages to other sub-amplifiers, referred to as "depressed supply voltages", to accommodate only the local maximum output voltage swing at these sub-amplifiers. These depressed supply voltages are generally increasing in the forward direction along the output transmission line towards the output port 130.

In this embodiment, a first supply voltage, i.e. the supply voltage to sub-amplifier 151 is different compared to a second supply voltage to a sub-amplifier in the second set of sub-amplifiers. For example, the supply voltage to sub-amplifier 151 is depressed compared to the supply voltages to the second set of sub-amplifiers to accommodate a local maximum output signal voltage swing at sub-amplifier 151. As shown in FIG. 3, both the maximum RF output current amplitude and the supply voltage of the first sub-amplifier 151 are 0.5, which is half of the values of a conventional power amplifier built with a single transistor with the same load resistance and output power. The supply voltages to sub-amplifiers in the second set are also different and configured to increase gradually in a forward direction along the first part of the output transmission line 141 to the output port 130. In this example, 5 sub-amplifiers 161, 162, 163, 164, 165 are included in the second set of sub-amplifiers 160, which are distributed at equal distances along the first part of the output transmission line 141. The distance between the adjacent sub-amplifiers corresponds to an electrical length of a quarter wave length at the center frequency of the operating frequency band of the power amplifier 100. In this way, the maximum RF output currents of the sub-amplifiers 161, 162, 163, 164, 165 in the second set of sub-amplifiers are weighted, typically with a Gaussian-like "bell" shape, with the largest contribution coming from the sub-amplifier 163, as shown in FIG. 3. This bell shape weighted output current gives low ripple both at the output port 130 and for the sub-amplifiers' RF output voltage amplitudes over a specified bandwidth. By proper timing of their respective drive signals, he sub-amplifier's contributions to the RF output voltage swing add synchronously in time, i.e. in phase, in the forward direction along the output transmission line towards the output port. The backwards traveling waves have time differences that make the sum of the output voltages from the sub-amplifiers appear low-pass filtered and appear only like a small ripple in the maximum output voltage amplitude for the input signals within the bandwidth of operating frequencies.

Figure 4A:
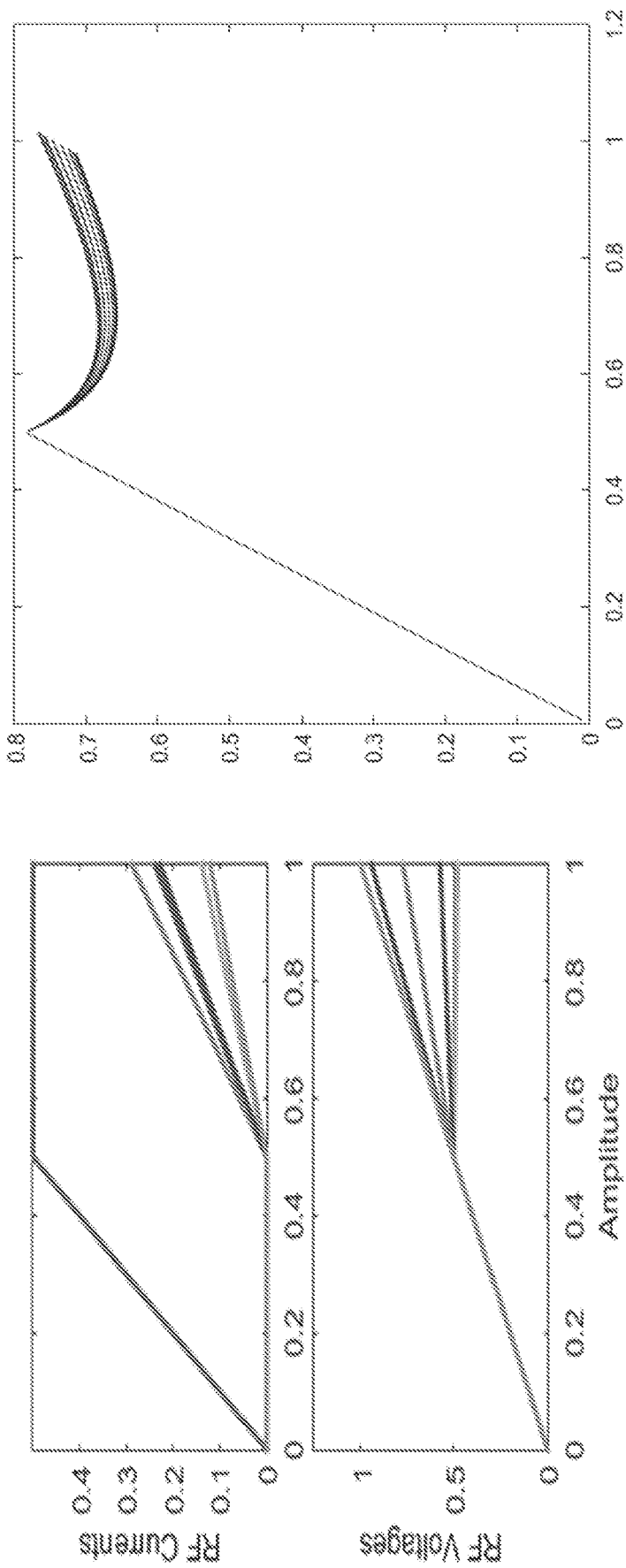
FIG. 4a is a diagram illustrating the electrical behaviour and efficiency of the distributed power amplifier shown in FIG. 2.

FIG. 4a shows a theoretical electrical behavior of the power amplifier 200 according to embodiments herein at a frequency within the bandwidth, where the RF output currents, output voltages and efficiency versus the input signal amplitude are shown, and all values shown on the Y-axis and X-axis in FIG. 4a are relative values. To the left of FIG. 4a, the RF output currents magnitudes are shown in the top pane, the RF output voltage amplitudes at all sub-amplifiers are shown in the bottom pane. To the right of FIG. 4a, the efficiency over the bandwidth is shown.

The first sub-amplifier 151 is operating alone with substantially linearly increasing RF output current below a transition point, e.g. at 0.5 of the maximum input signal amplitude, and with substantially constant RF output current above the transition point. Due to lack of reflections for a wave traveling in the forward direction along the output transmission line 141 towards the output port 130, this sub-amplifier 151 will ideally see a wideband, constant load. It can therefore theoretically be entirely ripple-free when operating alone below the transition point. The sub-amplifiers 161, 162, 163, 164, 165 in the second set of sub-amplifiers 160 are active above the transition point and the RF output currents from these sub-amplifiers increase piecewise linearly from zero above the transition point.

The RF output voltage amplitudes at all sub-amplifiers 151, 161, 162, 163, 164, 165 are all substantially identical below the transition point since the output transmission line 141 has uniform characteristic impedance, and only the sub-amplifier 151 at the beginning of the output transmission line 141 is active. Above the transition point the relative output voltage increase is larger for the sub-amplifiers closer to the end of the output transmission line 141. The RF voltage increases along the output transmission line to a large extent proportionally to the RF output current amplitudes of the sub-amplifiers. The supply voltages for the sub-amplifiers shown in FIG. 3 follow the maximum RF output voltage amplitudes as shown in FIG. 4a.

Figure 4B:
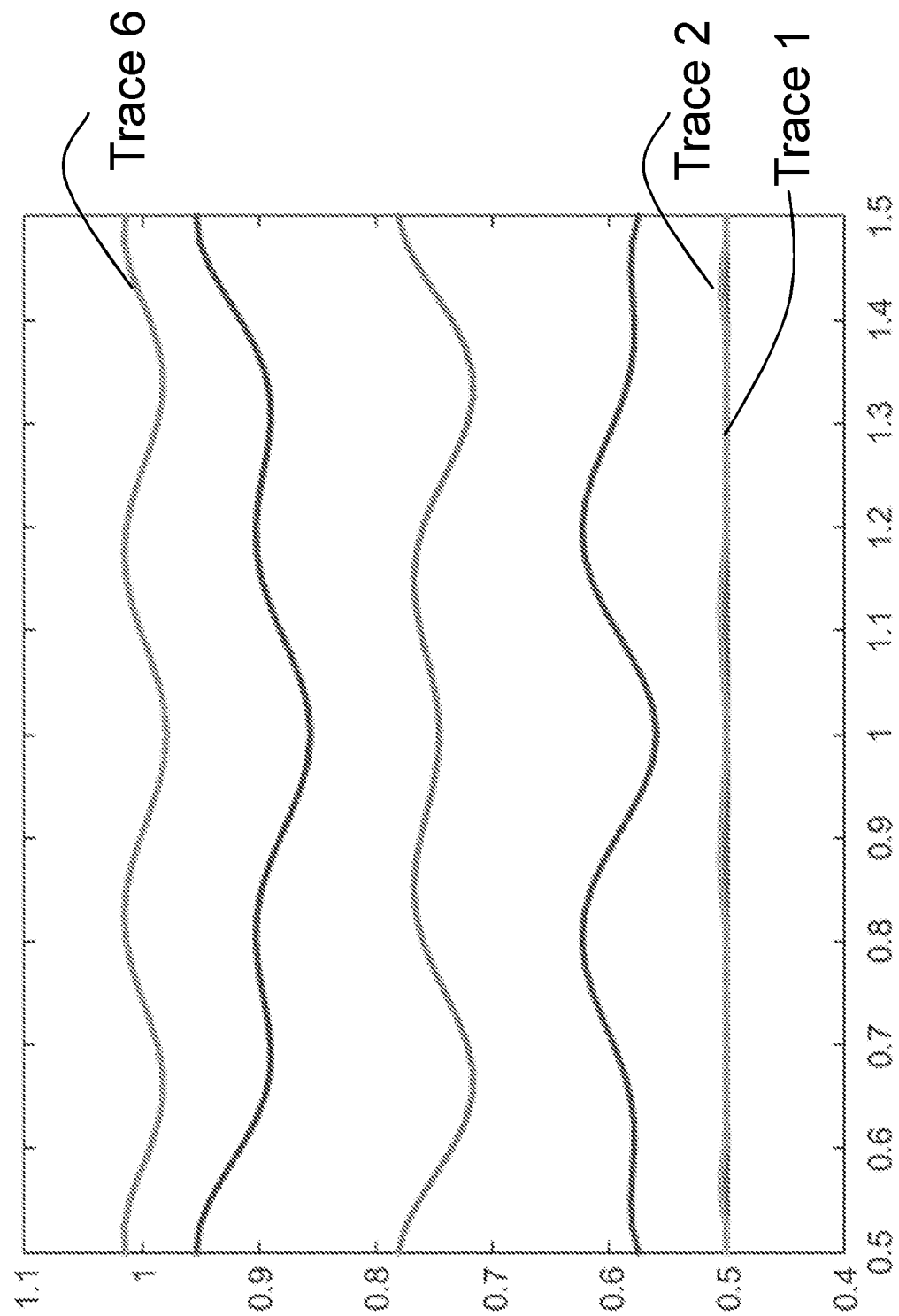
FIG. 4b is a diagram illustrating the output voltage ripples of the distributed power amplifier shown in FIG. 2.

At input signal amplitudes above the transition point, each sub-amplifier has some variation in the maximum RF output voltage over the bandwidth. This is seen in FIG. 4b, in which the X-axis represents relative frequencies within the bandwidth, Y-axis represents output voltage amplitude, and different traces represent the maximum RF output voltage for different sub-amplifiers, for example, the topmost trace, i.e. trace 6, represents the maximum RF output voltage for sub-amplifier 165 which is the closest to the output port 130 and have the highest maximum RF output voltage. As mentioned above, sub-amplifier 151 may theoretically be entirely ripple-free when operating alone below the transition point, and this can be seen from the lowermost trace, i.e. trace 1, which almost has no ripple compared to other traces. The ripple on the maximum RF output voltages for sub-amplifier 161, represented by trace 2 is also relative small. For sub-amplifiers 162, 163, 164, 165, the ripples are relatively larger. For these sub-amplifiers 162, 163, 164, 165, the large part of the ripples is interferences between backwards traveling waves. The ripple from the entire bell-weighted response of the backwards traveling waves is rather low, but the ripple from a truncated response, i.e. only a part of bell-weighted response of the backwards traveling waves, is relatively high. Since only a part of bell-weighted response of the backwards traveling waves is seen at these sub-amplifiers 162, 163, 164, 165, the ripples are relative large. For example, sub-amplifier 163 will see the backwards traveling waves from sub-amplifiers 164 and 165, in addition to its own contribution and the reflected response of the entire group of backwards traveling waves.

A consequence of the uniform impedance of the output transmission line is that for the first sub-amplifier 151 there is no impedance ripple. There is consequentially no electrical ripple caused by the impedance ripple, either at this sub-amplifier or the output port 130, below the transition point. Above the transition point the output voltage ripple increases with increasing amplitude since the backwards traveling waves from the rest of the sub-amplifiers are reflected at the first sub-amplifier and back towards the output port 130.

Turning again to FIG. 4*a*, the bottom pane illustrates the efficiency over the 3:1 bandwidth, i.e. from 0.5 to 1.5 times of the center frequency. It can be seen that, below the transition point, the efficiency is uniform when disregarding other bandwidth limiting effects, i.e. there is no variation in efficiency below the transition point. Above the transition point, the "efficiency ripple" increases as the input signal amplitude increases.

Figure 5:
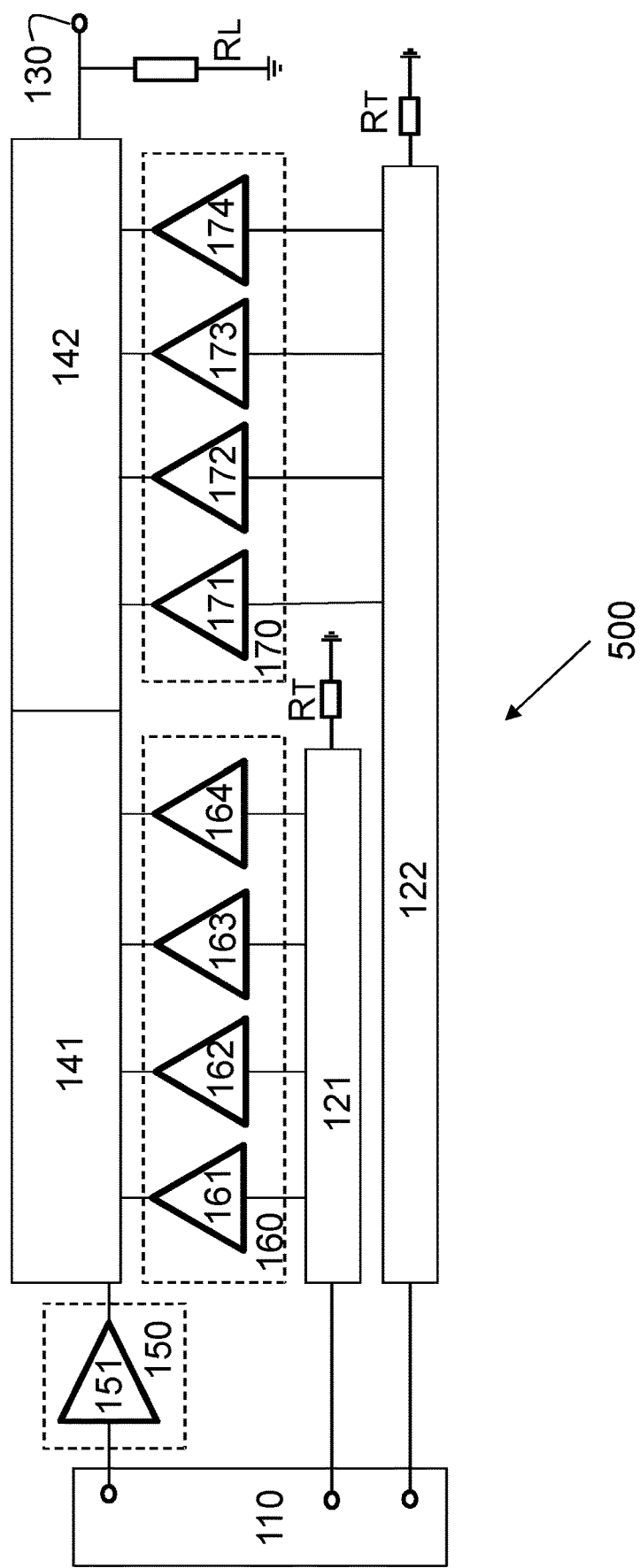
FIG. 5 is a block diagram illustrating a second example of a distributed power amplifier according to embodiments herein.

FIG. 5 shows a second example of the power amplifier 100, now denoted as power amplifier 500. The power amplifier 500 has a similar structure as the power amplifier 200, but with additional sets of sub-amplifiers and each set of sub-amplifiers has a different number of sub-amplifiers. As shown in FIG. 5, the power amplifier 500 comprises 3 sets of sub-amplifiers, a first set of sub-amplifiers 150, a second set of sub-amplifiers 160 and a third set of sub-amplifiers 170. The first set of sub-amplifiers 150 comprises one single sub-amplifier 151 placed at the beginning of a first part 141 of the output transmission line. The second set of sub-amplifiers 160 comprises four sub-amplifiers 161, 162, 163, 164 distributed along the first part 141 of the output transmission line, and the third set of sub-amplifiers 170 also comprises four sub-amplifiers 171, 172, 173, 174 distributed along a second part 142 of the output transmission line. The first and second parts of the output transmission line 141, 142 have uniform characteristic impedance and the second part of the output transmission line 142 is terminated in a load resistance $R_L$, which is matched to the characteristic impedance of the output transmission line 142.

According to this embodiment, the power amplifier 500 operates with two transition points, at 0.25 and 0.5 of the full output or input signal amplitude, and has a bandwidth of 2:1 with low ripple on the output voltage amplitude. The distance between adjacent sub-amplifiers corresponds to a quarter wave length at the center frequency.

Figure 6:
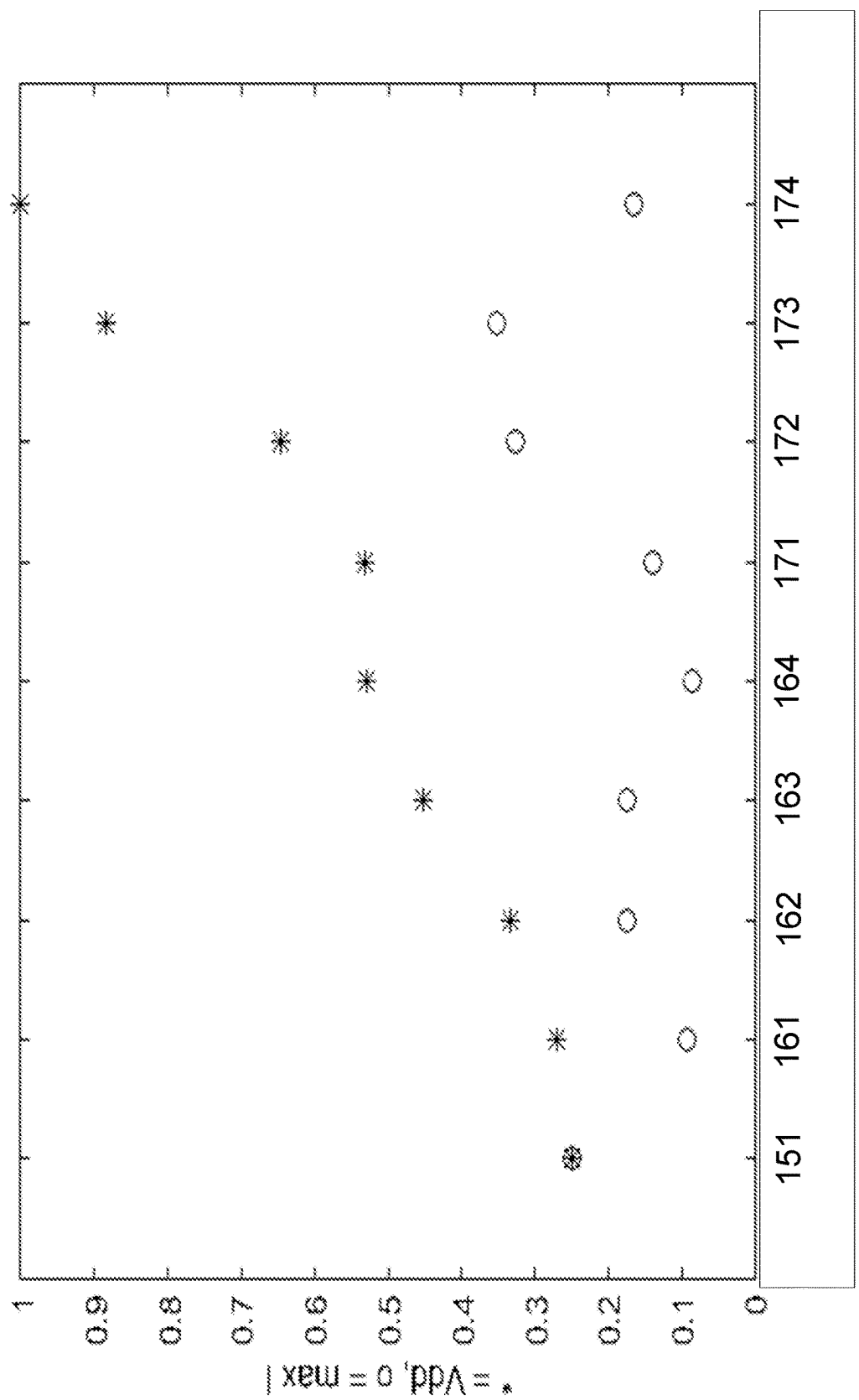
FIG. 6 is a diagram illustrating supply voltages and maximum output currents of the sub-amplifiers in the distributed power amplifier shown in FIG. 5.

The supply voltages and maximum RF output currents of the sub-amplifiers 151, 161-164, 171-174 are shown in FIG. 6. The maximum RF output current amplitude and supply voltage of the first sub-amplifier 151 are both 0.25 The maximum RF output currents for the second and third sets 160, 170 are both weighted substantially "bell shaped". The exact values for the bell shaped RF output currents are obtained by optimization. Otherwise, a simple but somewhat less optimal low-integer weighting coefficient may be, e.g. 3 for sub-amplifier 151, 1-2-2-1 for sub-amplifiers 161-164 and 2-4-4-2 for sub-amplifiers 171-174. The supply voltages to the sub-amplifiers in the second and third sets 160, 179 are configured to increase gradually in a forward direction along the first and second parts of the output transmission line 141, 142 to the output port 130.

Figure 7B:
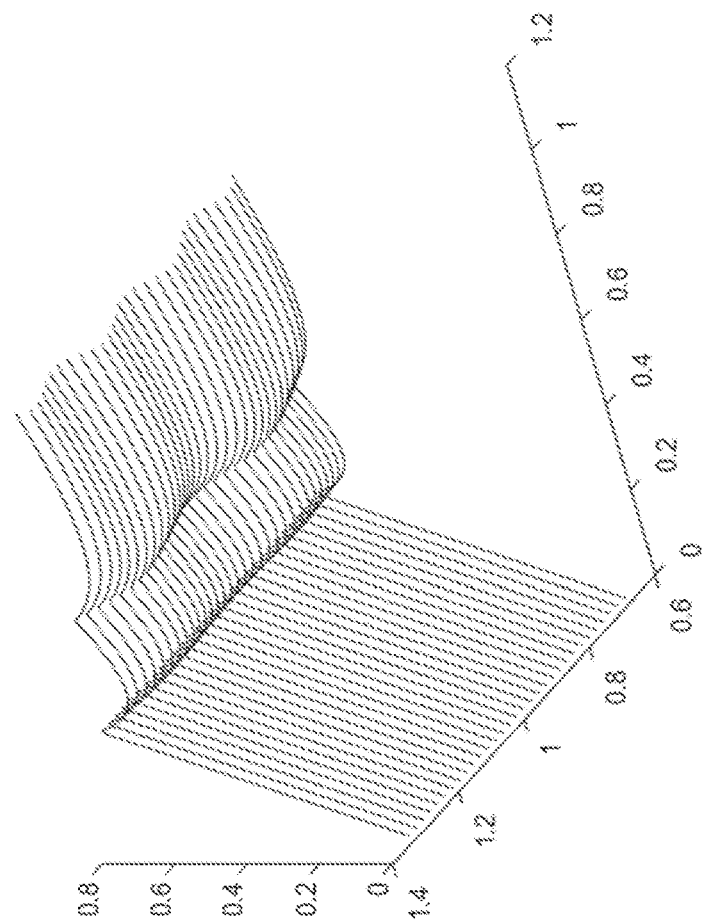
FIG. 7b is diagram illustrating the efficiency of the distributed power amplifier shown in FIG. 5.
Figure 7A:
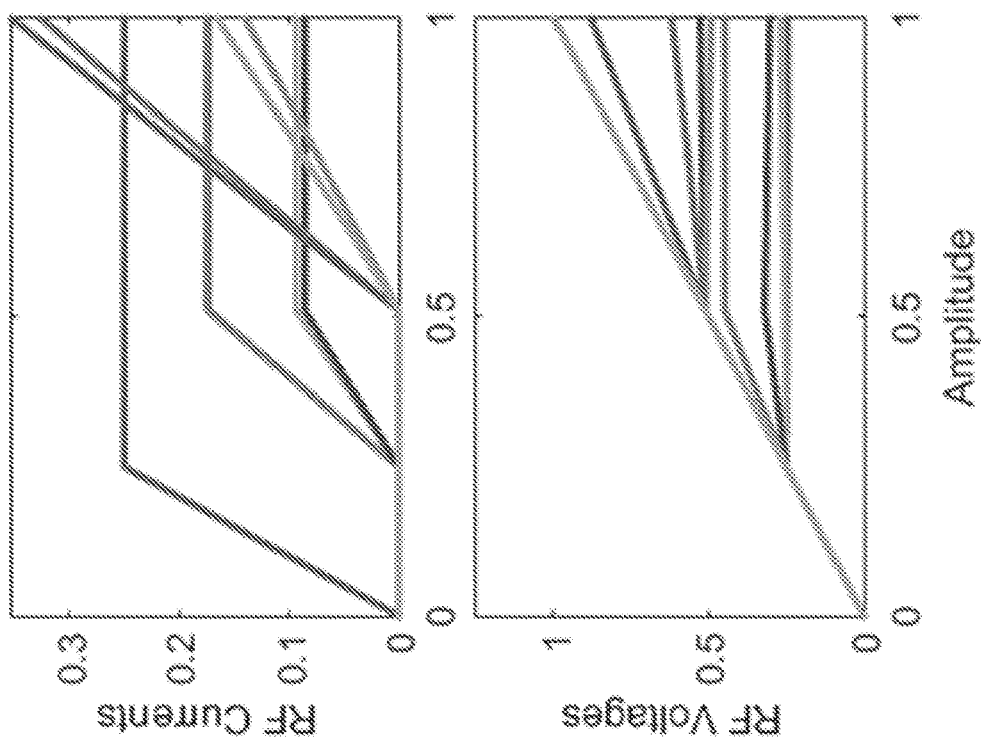
FIG. 7a is a diagram illustrating the electrical behaviour of the distributed power amplifier shown in FIG. 5.

The electrical behavior of the power amplifier 500 at the upper frequency edge of the bandwidth is shown in FIG. 7*a*, where the RF output currents magnitudes are shown in the upper pane and the RF output voltage amplitudes are shown in the lower pane.

The first sub-amplifier 151 is again operating alone below the first transition point 0.25 and with constant RF output current above the first transition point. The RF output currents of the 4 sub-amplifiers 161-164 in the first set are increasing above the first transition point, and constant above the second transition point. The RF output currents for the 4 sub-amplifiers 171-174 in the third set are increasing above the second transition point and all the way up to the full output power.

The other behaviors such as ripples and efficiency are similar to the power amplifier 200 described above. For example, there is no ripple on the output voltage amplitude below the first transition point, above the first transition point, the ripple increases with increasing output voltage amplitude. Further, below the first transition point, there is no variation in efficiency. Since there are two sets of distributed sub-amplifiers, each associated with a transition point, there are two efficiency peaks, one at the first transition point 0.25 and another one at the second transition point 0.5, as shown in FIG. 7*b*.

According to some embodiments herein, the sub-amplifier 151 in the power amplifier 200, 500 may be any type of power amplifiers, either conventional power amplifiers built with single or multiple transistors, or any new power amplifiers developed during time. Further, more sets of sub-amplifiers may be included and each set of sub-amplifiers may be associated with a transition point. Each set of sub-amplifiers may have different number of sub-amplifiers and are preferably configured to have a bell-shaped RF output current contribution.

Figure 8:
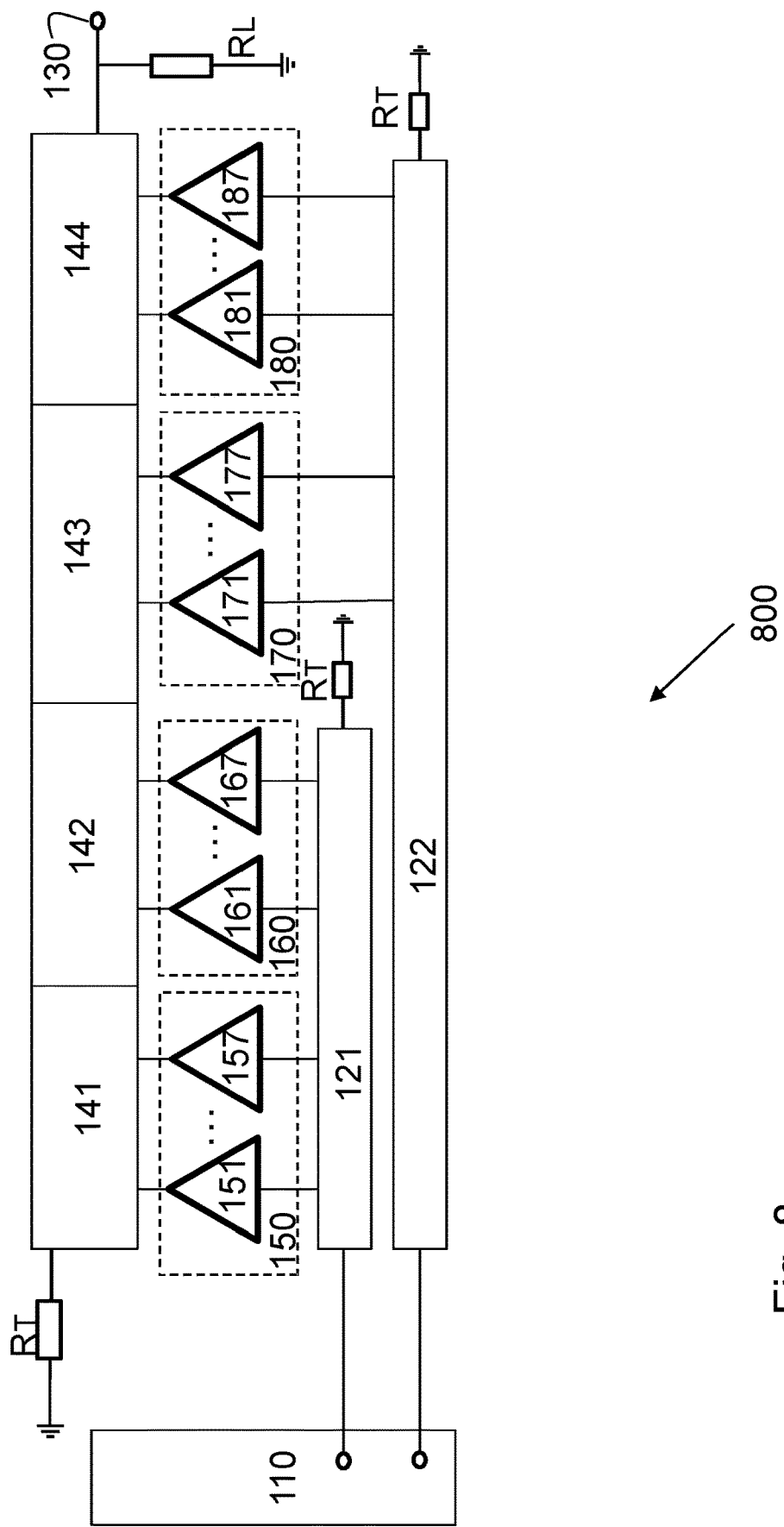
FIG. 8 is a block diagram illustrating a third example of a distributed power amplifier according to embodiments herein.

FIG. 8 shows a third example of the power amplifier 100, now denoted as power amplifier 800. The power amplifier 800 comprises 4 sets of sub-amplifiers, a first set of sub-amplifiers 150, a second set of sub-amplifiers 160, a third set of sub-amplifiers 170 and a fourth set of sub-amplifiers 180. Each set of sub-amplifier comprises seven sub-amplifiers. For example, the first set of sub-amplifiers 150 comprises seven sub-amplifier 151-157 distributed along a first part 141 of the output transmission line. The second set of sub-amplifiers 160 comprises seven sub-amplifiers 161-167 distributed along a second part 142 of the output transmission line, the third set of sub-amplifiers 170 comprises seven sub-amplifiers 171-177 distributed along a third part 143 of the output transmission line. The fourth set of sub-amplifiers 180 comprises seven sub-amplifiers 181-187 distributed along a fourth part 144 of the output transmission line.

All four parts of the output transmission line 141-144 have uniform characteristic impedance and the fourth part 144 of the output transmission line is terminated by a load resistance $R_L$, which is matched to the characteristic impedance of the output transmission line.

In this example the backwards traveling waves on the output transmission line are terminated by a matched resistive load $R_T$ at the beginning of the first part 141 of the output transmission line, which is at an arbitrary distance in the backwards direction, and thus the backwards traveling waves are not reflected back towards the output port 130. The distance between adjacent sub-amplifiers corresponds to an electrical length of a quarter wave length at the center frequency of operating frequencies.

Figure 9:
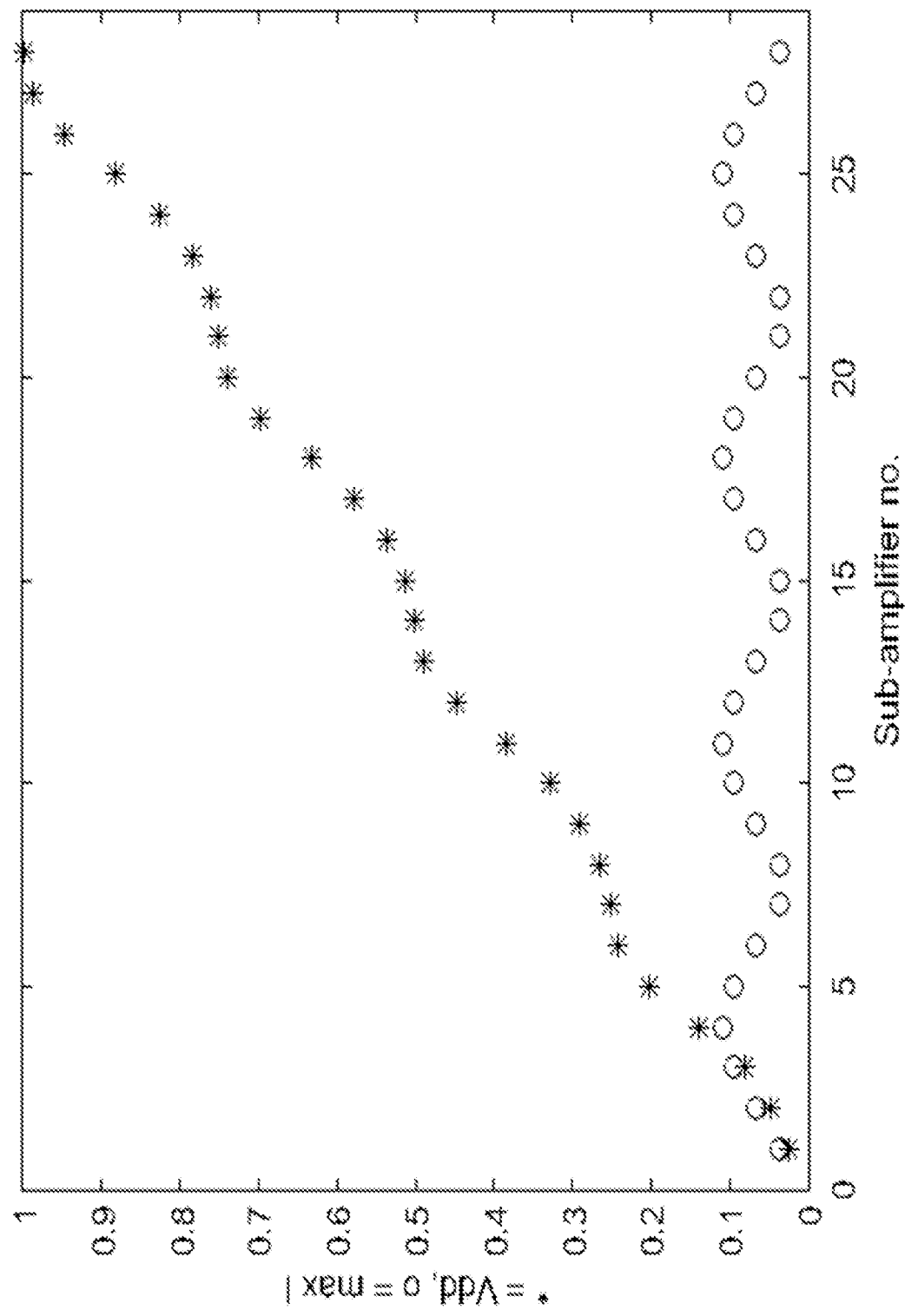
FIG. 9 is a diagram illustrating supply voltages and maximum output currents of the sub-amplifiers in the distributed power amplifier shown in FIG. 8.

The supply voltages and maximum RF output currents for each sub-amplifier are shown in FIG. 9. The supply voltages to the sub-amplifiers in each set are configured to increase gradually in a forward direction along its part of the output transmission line. The bell-shape weighted RF output currents contribution and numbers of sub-amplifiers per set affect only the efficiency and the bandwidth of high efficiency. This is because the additional RF voltage from the backwards traveling waves necessitates higher supply voltage, and this additional voltage ripple is only kept low within a prescribed bandwidth.

Figure 10A:
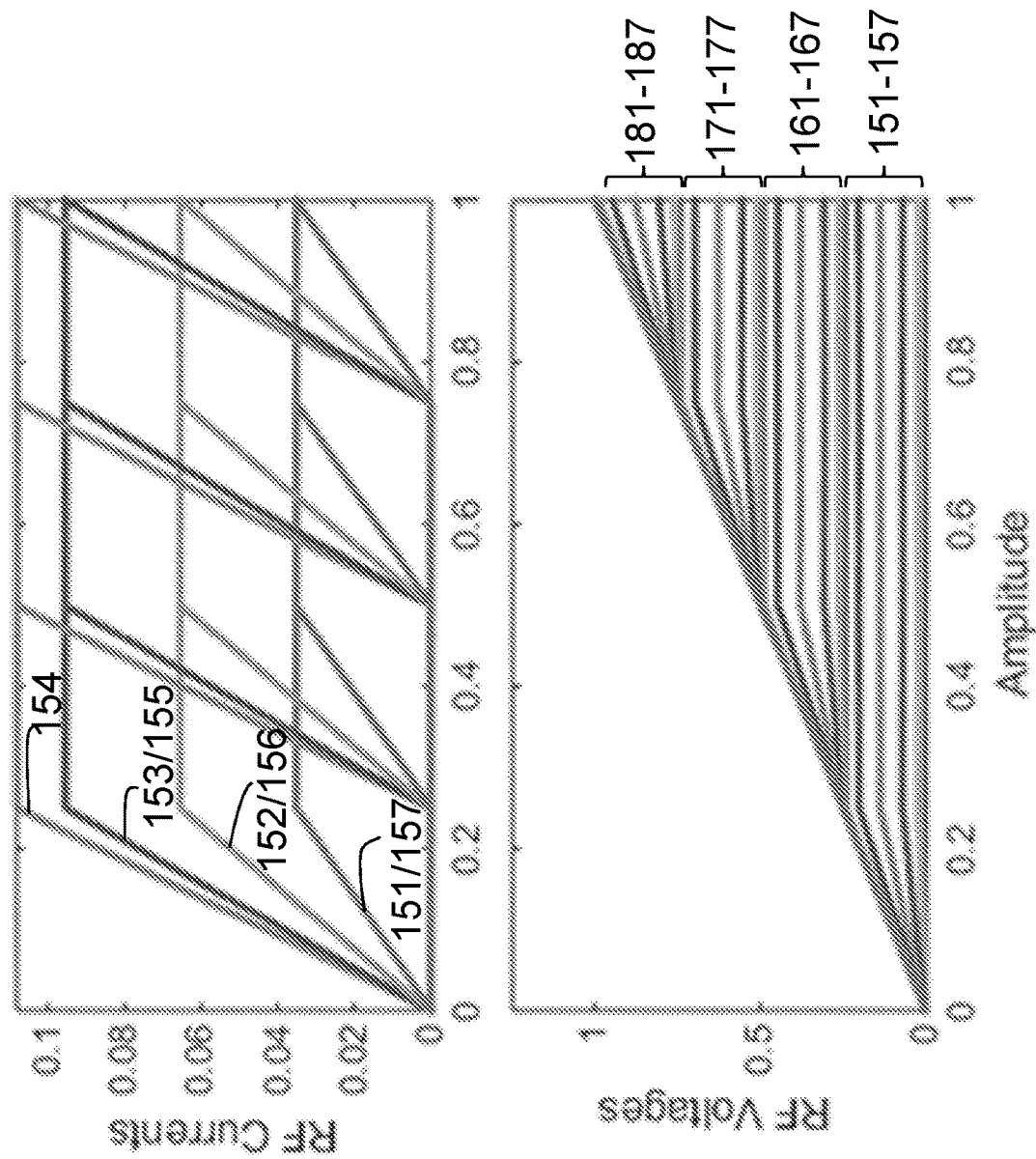
FIG. 10a is a diagram illustrating the electrical behaviour of the distributed power amplifier shown in FIG. 8.

The electrical behavior of the power amplifier 800 at the upper frequency edge of the bandwidth is shown in FIG. 10*a*, where the RF output currents magnitudes are shown in the upper pane and the RF output voltage amplitudes are shown in the lower pane.

According to this embodiment, the power amplifier 800 operates with three transition points, at 0.25, 0.5 and 0.75 of the full output or input signal amplitude, and has a bandwidth of 4:1 with low ripple on the output voltage amplitude. Below a first transition point 0.25, only the first set of sub-amplifiers 150 is active, the RF output currents of the sub-amplifiers 151-157 in the first set are increasing below the first transition point 0.25 and constant above the first transition point 0.25. Due to symmetry, the RF output currents from the sub-amplifiers 151-153 and sub-amplifiers 155-157 are pairwise equal and therefore their current curves are overlapped with each other, except the middle one, i.e. the sub-amplifier 154, as indicated in FIG. 10*a* by reference numbers. At the second transition point 0.5, both the first and second sets of sub-amplifiers 150, 160 are active. The RF output currents of the sub-amplifiers 161-167 in the second set are increasing above the first transition point 0.25, and constant above the second transition point 0.5. The RF output currents of the sub-amplifiers 171-177 in the third set are increasing above the second transition point 0.5 and constant above the third transition point 0.75. The RF output currents of the sub-amplifiers 181-187 in the fourth set are increasing above the third transition point 0.75 and all the way up to the full output power. It can be seen that there is certain similarity in the behavior of the different sets of sub-amplifiers.

Since the output transmission line 141-144 has uniform characteristic impedance, the RF output voltage amplitudes from each set of sub-amplifiers 150-180 have similar behavior, as shown in the lower pane of FIG. 10*a*, where four groups of curves are shown indicated by the sub-amplifiers' reference numbers. For example, the RF output voltage amplitudes from sub-amplifiers 151-157 are identical and linearly increasing below the first transition point, where they become active. Above that transition point, the relative RF output voltage amplitude increase is larger for the sub-amplifiers closer to the end of its output transmission line 141. Above the next transition point, the RF output voltage amplitudes are substantially constant.

The magnitudes of ripples on the maximum output voltage are similar for all sub-amplifiers, but the number of ripples over the bandwidth for each set of sub-amplifiers gets higher, when more sets of the sub-amplifiers are active or involved. This is due to longer duration of the total impulse response of the backwards traveling waves.

Figure 10B:
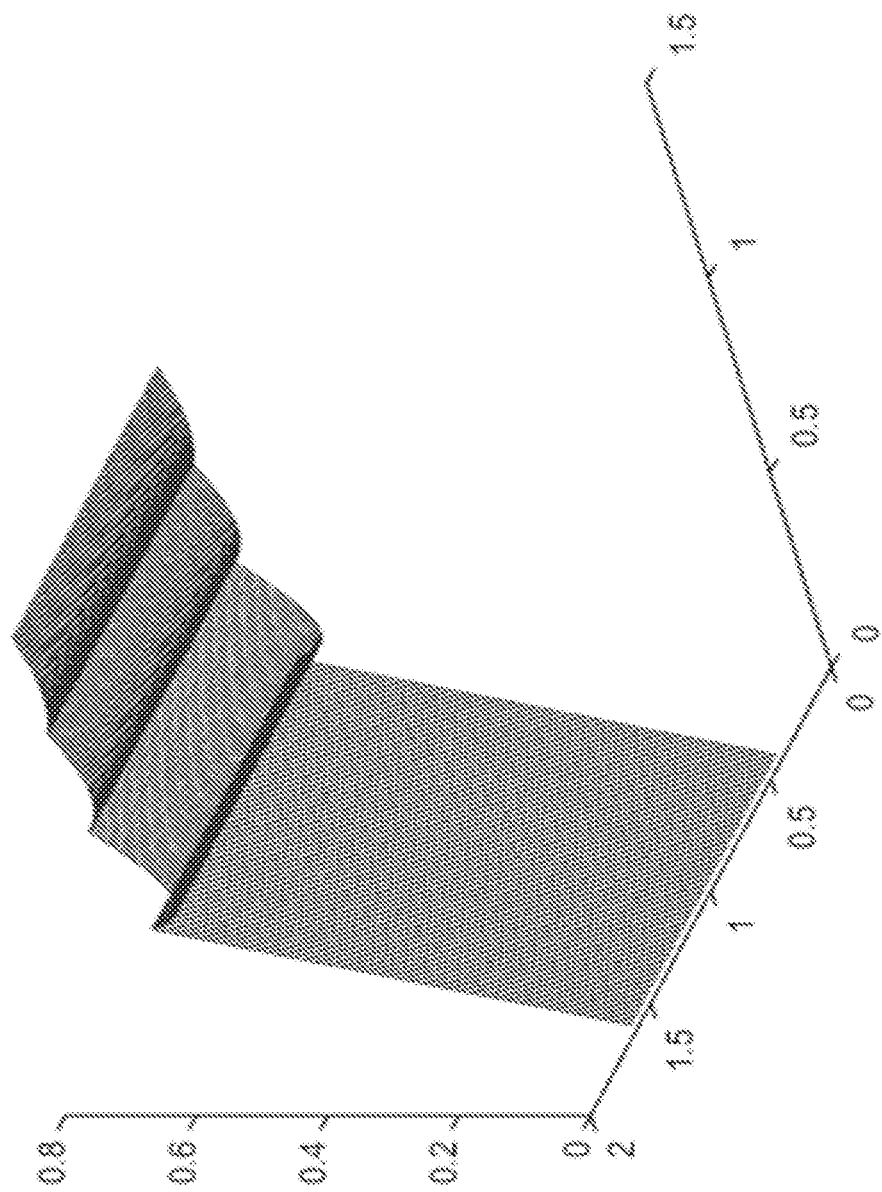
FIG. 10b is diagram illustrating the efficiency of the distributed power amplifier shown in FIG. 8.

FIG. 10*b* shows the efficiency curve across the 4:1 bandwidth for the power amplifier 800. It can be seen that there are three efficiency peaks located at the first transition point 0.25, the second transition point 0.5 and the third transition point 0.75 respectively. The efficiency is lower for the first set of sub-amplifiers 150 compared to the last set despite all sets of sub-amplifiers being identical in respect of current. This is because the supply voltages are lower for the first set but the voltage ripple is similar compared to other sets. The headroom to accommodate the ripple is thus a bigger part of the total supply voltage for the first set of sub-amplifiers. Since the DC power is proportional to the supply voltage, this lowers the efficiency more for the first set.

Figure 11:
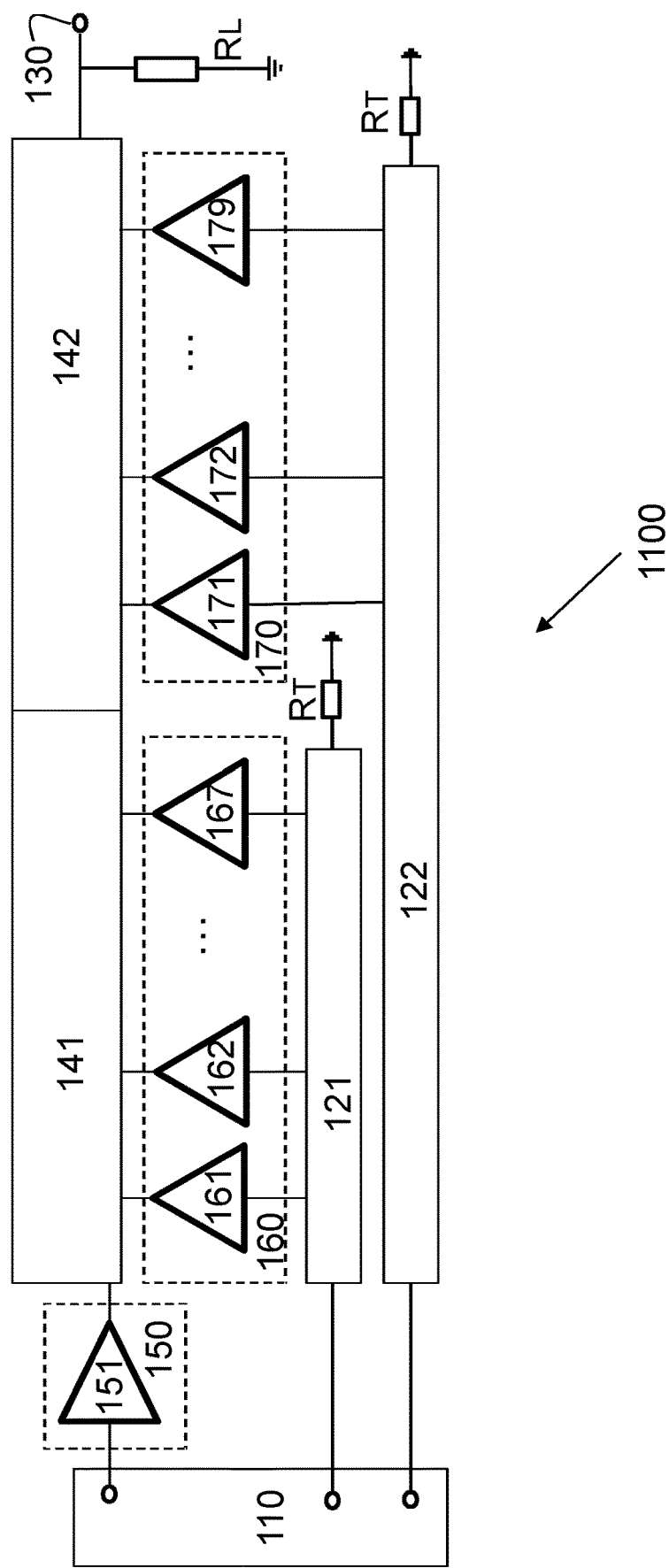
FIG. 11 is a block diagram illustrating a fourth example of a distributed power amplifier according to embodiments herein.

According to some embodiments herein, different parts of the output transmission line which are associated with different sets of sub-amplifiers may have different characteristic impedance. FIG. 11 shows a power amplifier 1100 with the similar structure as the power amplifier 500 shown in FIG. 5. In this embodiment, the first set of sub-amplifiers 150 comprises only one sub-amplifier 151, and is followed by two distributed groups, of which the second set 160 has 7 sub-amplifiers distributed along a first part of output transmission line 141, and the third set 170 has 9 sub-amplifiers distributed along a second part of output transmission line 142.

Figure 12A:
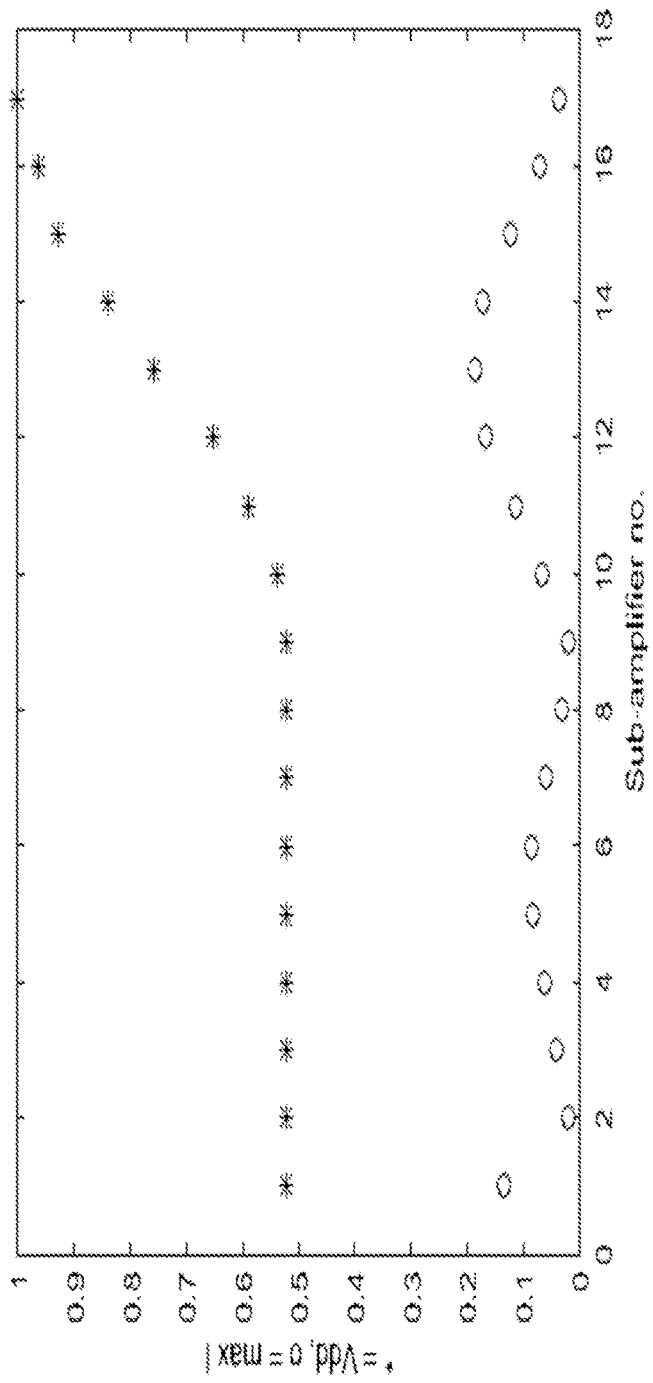
FIG. 12a is a diagram illustrating supply voltages and maximum output currents of the sub-amplifiers in the distributed power amplifier shown in FIG. 11.
Figure 12B:
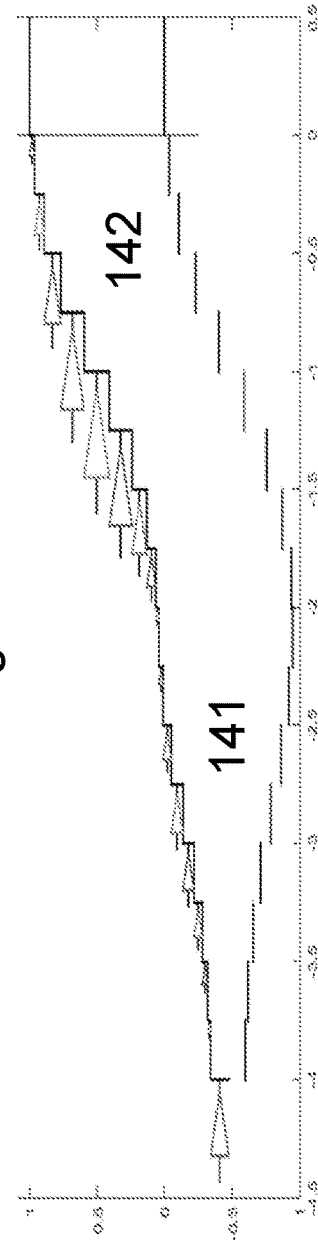
FIG. 12b is a diagram illustrating one example of the output transmission line implemented in the distributed power amplifier shown in FIG. 11.

In FIG. 12*a*, the supply voltages and maximum output currents for all sub-amplifiers are shown. The shape of the output transmission line is shown in FIG. 12*b*. It can be seen that the first part of output transmission line 141 is a stepwise tapered transmission line, i.e. the first part of the output transmission line 141 has higher impedance at the beginning and decreased impedance towards the output port, and the second part of output transmission line 142 is a transmission line with uniform impedance. The supply voltages to the first sub-amplifier 151 and the second set of sub-amplifiers 161-167 are equal, whereas they are increasing in the forward direction along the output transmission line towards the output port for the third set 170, as seen in the upper curve indicated by the star symbol. The patterns formed by the maximum RF output currents from each sub-amplifier in the second and third sets of sub-amplifiers are also bell shaped per distributed group as seen in the lower curve indicated by the small circle symbol. The step size and the width of the amplifier symbol shown at junctions of the upper side of the output transmission line correspond to the maximum RF output current of the sub-amplifier located at that junction.

Figure 13A:
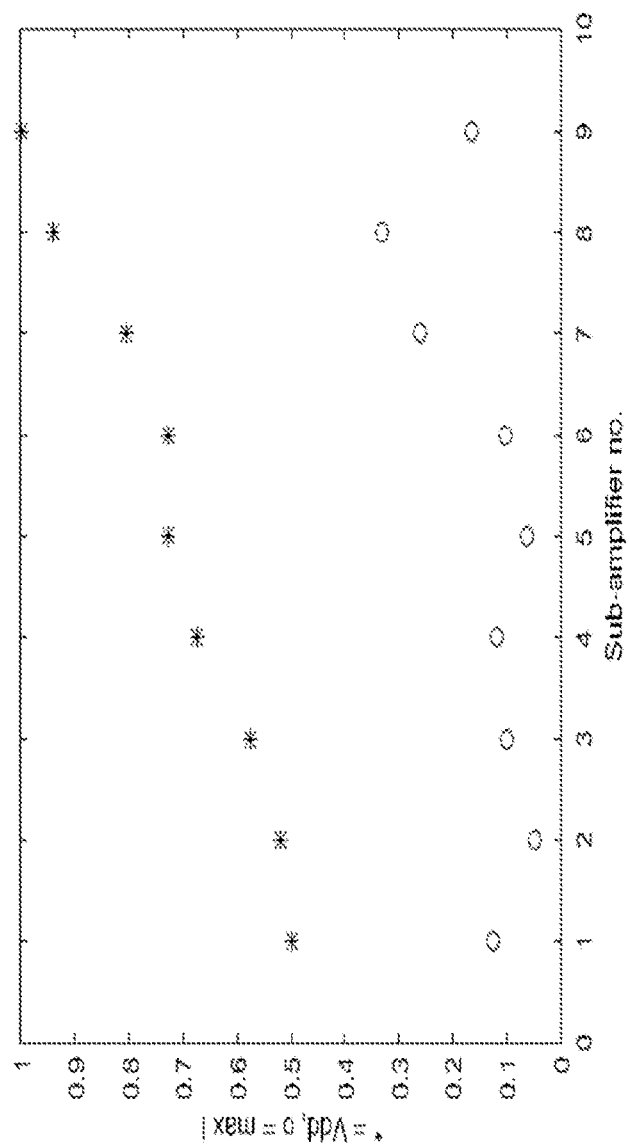
FIG. 13a is a diagram showing supply voltages and maximum output currents for sub-amplifiers in the power amplifier shown in FIG. 5.
Figure 13B:
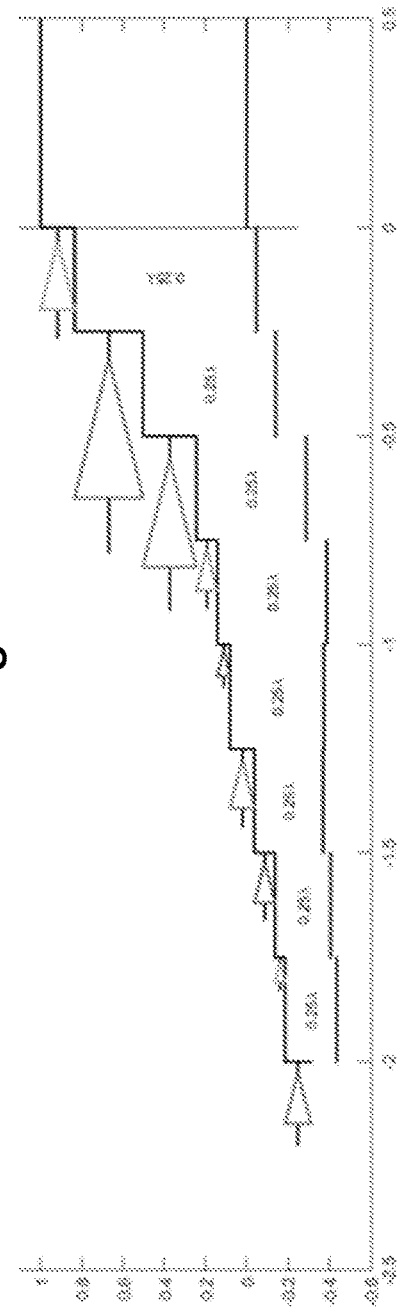
FIG. 13b shows one example of an output transmission line according to embodiments herein.
Figure 14:
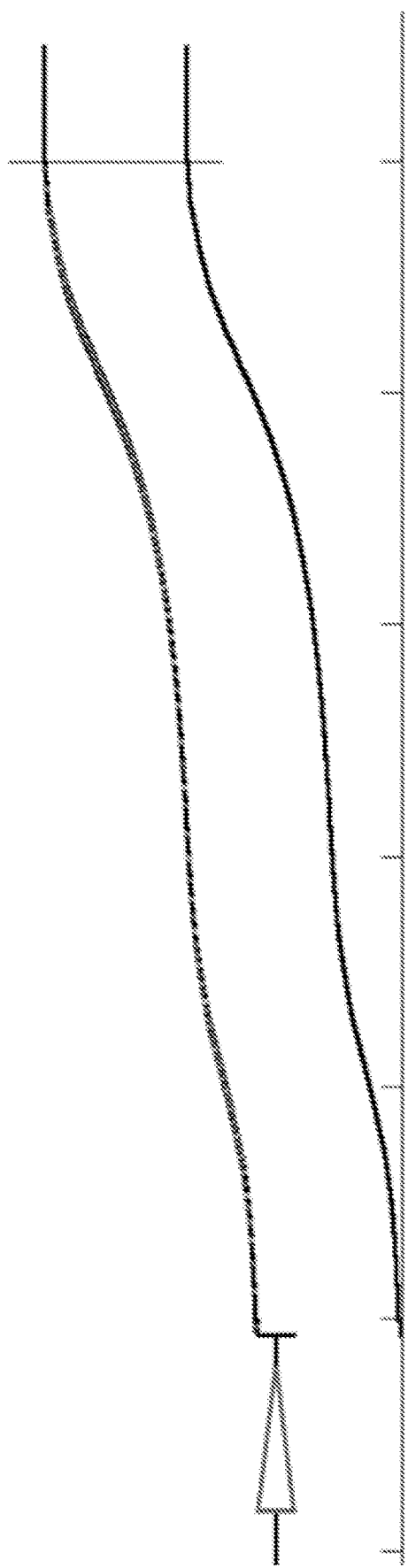
FIG. 14 is diagram illustrating one example of an output transmission line according to embodiments herein.

According to some embodiments herein, any set of sub-amplifiers may be distributed along a part of the output transmission line with uniform impedance and depressed supply voltages, or may be distributed along a part of the output transmission line with tapered shape and constant supply voltage. Within any set of sub-amplifiers, it is also possible to combine varying impedance and differently depressed supply voltages. FIG. 13*a* shows the supply voltages and maximum output currents for all sub-amplifiers for the power amplifier 500 shown in FIG. 5, wherein a first sub-amplifier 151 is followed by two sets of sub-amplifiers 160, 170, with 4 sub-amplifiers in each set. FIG. 13*b* shows an output transmission line whose impedance is decreasing by steps towards the output port. The admittance of a transmission line on a substrate with even dielectric thickness is largely proportional to the width of the transmission line. So in this case, the output transmission line has high impedance at the beginning and decreased impedance towards the output port. Therefore both the impedance and the supply voltages will vary along the output transmission line. The maximum RF output currents also here follow a bell shape per distributed set. The supply voltages, RF output currents and local characteristic impedances are in this example simply the geometrical mean of their values in the "pure" implementations, i.e. interpolated halfway between logarithmically. For example, the supply voltage to the first sub-amplifier 151 is half of the value for a pure tapered impedance implementation, but twice that of a pure uniform impedance implementation. Other points of interpolation are also possible There is often an advantage of having identical sub-amplifiers due to the simplicity of having fewer different amplifier chips in production and economies of scale in the production of chips or sub-amplifiers. For example, the sub-amplifiers may be identical or equal-sized by making the sub-amplifiers with transistors in same width and length. Bell-shaping of the local RF output current density for the distributed sets of sub-amplifiers can then be achieved by placing the sub-amplifiers more closely to each other along the output transmission line in the middle of the sets. This non-equidistant placement of equal-sized sub-amplifiers along the output transmission line is shown FIG. 14, in which the local slope of the output transmission line indicates the local density of the sub-amplifiers, i.e. the steeper the slope, the denser the sub-amplifiers. In this example, there are 145 identical sub-amplifiers distributed non-equidistant along the output transmission line. With the timing of input driving signals to the sub-amplifiers distributed in the same way, the contributions from each sub-amplifier to the RF output voltage swing will add synchronously in time in the forward direction along the output transmission line toward the output port. Since the RF output voltage swing increases towards the output port by almost equal amounts for each sub-amplifier in the distributed sets, the supply voltages for the sub-amplifiers in each set increase linearly along the output transmission line towards the output port. A small amount of headroom is used to accommodate the ripple from the backwards traveling waves.

There can be an advantage of having two or more different types of sub-amplifiers instead of just one, since the ones distributed along the beginning of the output transmission line otherwise will have unnecessarily high breakdown voltage at the expense of other desirable characteristics and cost. Further, having too many supply voltages may also be a problem. A suboptimal solution is to use a reduced set of voltages, for example 7 or 10 supply voltages for all sub-amplifiers to share, instead of 145 supply voltages in this example if each sub-amplifier requires its own.

According to some embodiments herein, any parts of the output transmission line may have lower impedance at the start of the output transmission line and higher or increased impedance towards the output port. The supply voltages for the sub-amplifiers close to the start of the output transmission line will then be lower than those of sub-amplifiers distributed along a uniform impedance transmission line. Alternatively, any parts of the output transmission line may have higher impedance at the start of the output transmission line and decreased or lower impedance towards the output port. Then for sub-amplifiers at the start of the output transmission line, the supply voltages will be higher, but their currents will be smaller. Both the lowered impedance/voltage variants and the increased impedance/voltage ones have potential benefits, typically by allowing the use of other transistor technologies with better performance for the required frequency range.

In the following, some implementation aspects will be discussed with respect to the embodiments herein. Depending on the desired bandwidth, efficiency and ripple, the power amplifier 100, 200, 500, 800, 1100 may be implemented with few or many sub-amplifiers per set or per distributed group. Bell-shaping of the RF output currents from the distributed sub-amplifiers along the output transmission line for each set of sub-amplifiers gives shorter total physical length of transmission line, or equivalently shorter transit time. It is often desired to keep the physical length of transmission line short if it has large losses per length, or the physical space is limited for a given specification but is otherwise not necessary. The aim of the bell-shaping of the RF output currents is primarily to keep the side lobe level of the frequency response of the backwards traveling wave low at frequencies above the lower frequency edge of the operating bandwidth, since that determines how much backwards traveling wave power that gets dumped in a terminating resistor, as well as a part of the ripple amplitude on the RF output voltages at the sub-amplifiers. Window functions may give good initial bell shapes, for example, Dolph-Chebyshev, Gaussian, Binomial, Hamming, Blackman etc. The general solution for increasing the relative bandwidth, reducing the ripple or increasing the efficiency is to use more but smaller sub-amplifiers spread out over a longer transmission line. Keeping the total length of transmission line (or equivalent circuits) short is generally good since there is always a loss per unit length of transmission line. The tradeoffs between the positive and negative aspects of having longer transmission line are different for different implementation technologies.

To be optimally efficient, the sub-amplifiers will need different, but generally fixed, DC supply voltages. Reducing the number of different voltages by having the same supply voltage to several sub-amplifiers is often possible with little loss of efficiency and the benefits of low ripple and large bandwidth are not affected. For example, the supply voltages may be shared by sub-amplifiers in the same set or in the different set. As shown in FIGS. 3, 6 and 9, the supply voltage to the first sub-amplifier in the next set may be close to, or the same as the supply voltage to the last sub-amplifier in the previous set. Switching DC-DC converters, which can provide multiple simultaneous DC voltages with only a single inductor, can reduce the size and cost of providing these DC supply voltages compared to having DC-DC converters with only a single DC voltage each.

With different supply voltages to the drain terminals of the transistors in the different sub-amplifiers, these DC supply voltages need to be blocked by capacitors from short-circuiting through the transmission line. This may be a problem in some implementations since these DC blocking capacitors scale inversely with the lowest supported frequency. The drain terminal of the transistor is the sensitive one from the circuit perspective since it has RF output voltage swing. It may therefore be an advantage to have different source terminal DC voltages to the different sub-amplifiers and instead have the drain terminals coupled directly to the output transmission line.

Termination of the backwards traveling waves may be done by having a termination resistor at the start of the output transmission line, as shown in FIGS. 1 and 8. Backwards termination can also be performed between distributed groups by placing a sufficiently wideband isolator between their respective output transmission line segments, i.e. isolators may be placed between some parts or each part of the output transmission line.

The high efficiency of the power amplifier 100, 200, 500, 800, 1100 according to embodiments herein may be realized by using high-efficiency waveforms, for example the power amplifier is driven to operate in Class B, C or F. Power amplifiers with very large bandwidths may require special designs, such as push-pull coupled transistors in the sub-amplifiers. In some such cases the power amplifier 100, 200, 500, 800, 1100 according to embodiments herein may also be implemented differentially, with a balun at the input port 110 to provide differential input signals and the sub-amplifiers may be fully differential. Other implementations may also be feasible, the bandwidth and other requirements may require specific circuit techniques being used.

Correct timing of the drive signals to each sub-amplifier is achieved by matching the propagation times between the sub-amplifiers on the input transmission line 121, 122 to those on the output transmission line 141, 142, 143, 144. The nonlinear amplitude shaping of the drive signals can be performed in different ways. One way of getting different amplitude turn-on points is to use single-transistor amplifiers biased in Class AB and differently biased Class C amplifiers. This can be done at the sub-amplifier transistors directly, or in a driver stage. Upper amplitude limitation, amplitude clamping, can be achieved by saturation in either the sub-amplifiers or in a driver stage. Another way to achieve upper amplitude limitation is by subtracting the RF output signal from a lower biased amplifier from that of a higher biased one. In this way, one can get a signal with a slope amplitude over a certain range and flat amplitude above that range. Another method is shaping the signal amplitude by multipliers, modulators or mixers, either in the analog or digital domain.

Drive signals to a set of sub-amplifiers may be split at different points and by different methods. One consideration is that the method to distribute the drive signals is sufficiently wideband so that the voltage amplitudes at the transistors' gates are correct and the timing differences of the drive signals to the different sub-amplifiers matches the time delays over the output transmission line. According some embodiments, resistive input impedance at the input of the sub-amplifiers is provided that matches the admittance steps of a decreasing admittance input transmission line. According to some embodiments, broadband dividers plus individual input transmission lines may be preferable. To achieve the best gain-bandwidth product, the input capacitances of the transistors in the sets of distributed sub-amplifiers may be taken into account and absorbed into a synthetic transmission line, e.g. into the input transmission lines 121, 122.

Parasitic reactance at the output of the transistors in the sub-amplifiers can be handled in many ways. Pure capacitance at the transistor output node can usually be absorbed into the output transmission line, so that the output transmission line may consist of synthetic transmission lines of this capacitance and shorter transmission line segments of higher impedance. Alternatively, the output transmission line may only consist of series inductance in addition to the transistor capacitance, or a combination of inductance and transmission line. Further, lead inductance may be cancelled by using a negative transformer as part of the series inductance in a transmission line. Generally, improving high frequency performance calls for more but smaller transistors being used in the sub-amplifiers, and/or mostly synthetic transmission lines being used, i.e. that most of the capacitance of the transmission line is provided by the transistor's capacitance.

Even though embodiments of the various aspects have been described, many different alterations, modifications and the like thereof will become apparent for those skilled in the art. For example, the power amplifier according to embodiments herein may have different sets of sub-amplifiers and each set may have a different number of sub-amplifiers, may have different output transmission lines with different shape and characteristic impedance, may have different configurations for supply voltages, maximum output currents and transition points etc. The described embodiments are therefore not intended to limit the scope of the present disclosure.

Some advantages may be concluded from the described embodiments above. For example, techniques and methods described according to embodiments herein may be used to build power amplifiers with high efficiency in wide amplitude ranges and over arbitrarily large relative bandwidths. The power amplifiers according to embodiments herein may be designed to operate with uniform drive signals in a single wide band mode. The power amplifiers according to embodiments herein may be implemented with few or many sets of sub-amplifiers corresponding to numbers of efficiency peaks in backed off operation. With certain properties for the sub-amplifier sets, it is possible to make a cascade of sets to achieve any number of efficiency peaks. The power amplifiers according to embodiments herein may be implemented with few or many sub-amplifiers per set with the consideration of more sub-amplifiers enabling wider bandwidths, lower ripple or higher efficiency, or any combination of these. The output signal may be theoretically ripple-free at all output amplitudes and at all frequencies by termination of the backwards traveling waves. The power amplifiers according to embodiments herein may be implemented with equidistant or non-equidistant sub-amplifiers and with equal-sized or non-equal-sized sub-amplifiers depending on different requirements. The power amplifiers according to embodiments herein may have other variants including using uniform transmission line only for some distributed sets of sub-amplifiers, interpolations and extrapolations with other type of transmission lines, such as tapered or stepwise transmission line, quarter-wave length, unequal-length and continuous tapered transmission lines, and using in-between transmission line impedance profiles together with "partially depressed" supply voltages. Furthermore, embodiments of the power amplifier herein may be combined with many other amplifier techniques and may enable improved high-frequency operation.

Figure 15:
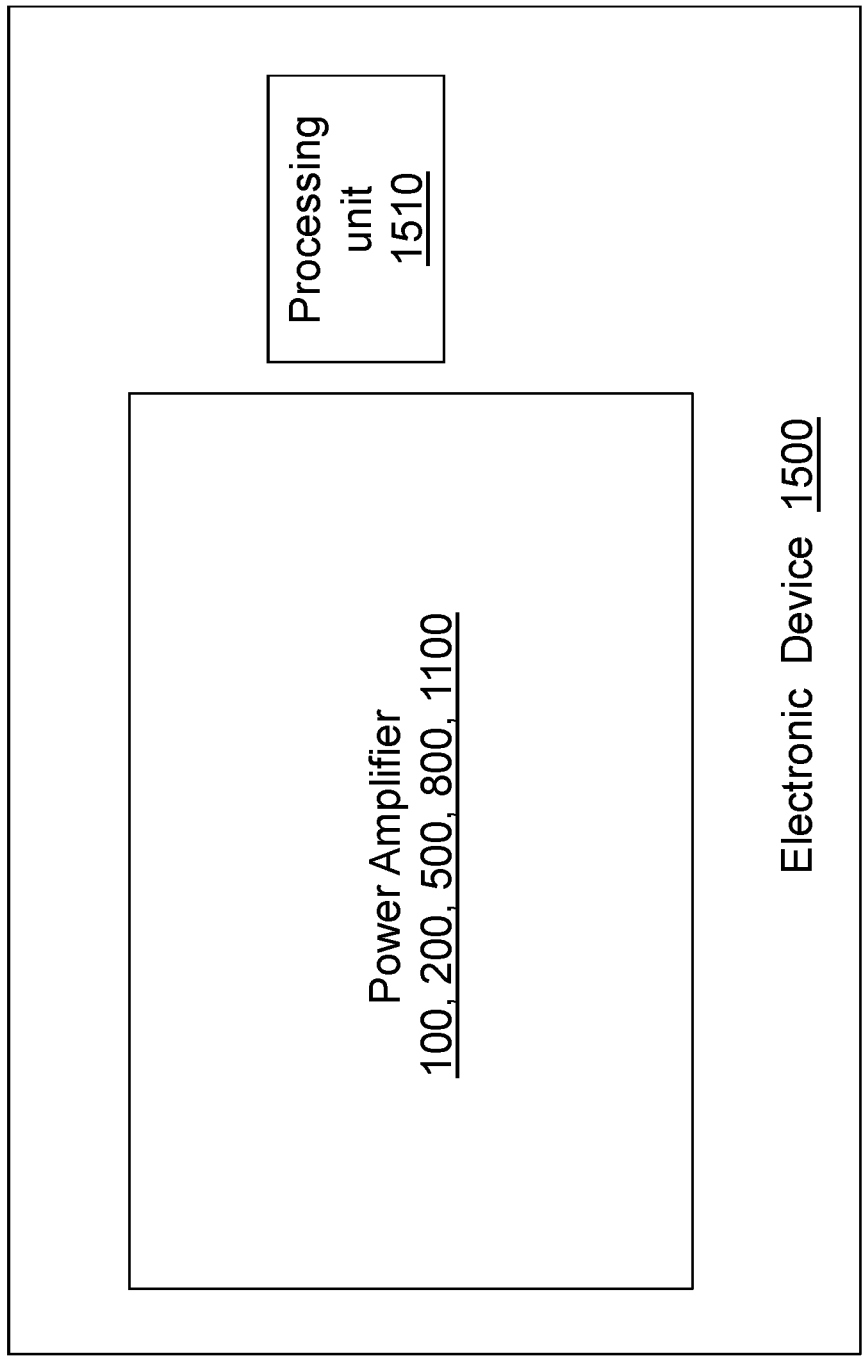
FIG. 15 is block diagram showing an electronic device.

The power amplifier 100, 200, 500, 800, 1100 according to embodiments herein may be employed in various electronic devices. FIG. 15 shows a block diagram for an electronic device 1500, which may be, e.g. a radio frequency transceiver, a wireless communication device, a user equipment, a mobile device, a base station or a radio network node etc. in a wireless communication systems, or any general electronic circuit or equipment which needs a power amplifier. The electronic device 1500 may comprise other units, where a processing unit 1510 is shown.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the invention, which is defined by the appending claims.

The invention claimed is:

1. A power amplifier configured for amplifying an input signal into an output signal, wherein the power amplifier comprises:
   an input port configured for receiving the input signal;
   an output port, coupled to an output transmission line, configured for providing the output signal; and
   multiple sets of sub-amplifiers distributed along the output transmission line, wherein inputs of the multiple sets of sub-amplifiers are coupled to the input port, and outputs of the multiple sets of sub-amplifiers are coupled to the output transmission line, and wherein at least two different supply voltages are provided for the sub-amplifiers in the multiple sets of sub-amplifiers, such that the supply voltage to at least one of the sub-amplifiers is reduced compared to the supply voltage to at least one other one of the sub-amplifiers.

2. The power amplifier according to claim 1, wherein a first set of sub-amplifiers of the multiple sets of sub-amplifiers comprises one sub-amplifier placed at the beginning of the output transmission line, a second set of sub-amplifiers of the multiple sets of sub-amplifiers comprises at least two sub-amplifiers distributed along a first part of the output transmission line, and wherein the at least two different supply voltages include a first supply voltage to the one sub-amplifier in the first set that is different compared to a second supply voltage to a sub-amplifier in the second set of sub-amplifiers.

3. The power amplifier according to claim 2, wherein the first part of the output transmission line has uniform impedance.

4. The power amplifier according to claim 1, wherein a first set of sub-amplifiers of the multiple sets of sub-amplifiers comprises at least two sub-amplifiers, and wherein the at least two sub-amplifiers are distributed along a first part of the output transmission line.

5. The power amplifier according to claim 4, wherein the first part of the output transmission line has uniform impedance.

6. The power amplifier according to claim 4, wherein a second set of sub-amplifiers of the multiple sets of sub-amplifiers comprises at least two sub-amplifiers distributed along a second part of the output transmission line.

7. The power amplifier according to claim 6, wherein the at least two different supply voltages include supply voltages to the at least two sub-amplifiers in the first set or supply voltages to the at least two sub-amplifiers in the second set that are configured to increase gradually in a forward direction along the first part or the second part of the output transmission line towards the output port.

8. The power amplifier according to claim 6, wherein a third set of sub-amplifiers of the multiple sets of sub-amplifiers comprises at least two sub-amplifiers distributed along a third part of the output transmission line.

9. The power amplifier according to claim 2, wherein a third set of sub-amplifiers of the multiple sets of sub-amplifiers comprises at least two sub-amplifiers distributed along a third part of the output transmission line.

10. The power amplifier according to claim 9, wherein at least one of the second part and/or third part of the output transmission line has uniform impedance.

11. The power amplifier according to claim 9, wherein the at least two different supply voltages include supply voltages to the sub-amplifiers in the second and/or third set that are configured to increase gradually in a forward direction along the second and /or third part of the output transmission line towards the output port.

12. The power amplifier according to claim 9, wherein the sub-amplifiers in any one or more of the first, second or third sets of sub-amplifiers are distributed non-equidistant along the first part and/or the second part and/or the third part of the output transmission line, which has uniform impedance.

13. The power amplifier according to claim 9, wherein the sub-amplifiers in any one or more of the first, second or third sets of sub-amplifiers are distributed at an equal distance along the first part and/or the second part and/or the third part of the output transmission line, which has uniform impedance.

14. The power amplifier according to claim 13, wherein the distance between adjacent sub-amplifiers corresponds to an electrical length of a quarter wave length at a center frequency of an operating frequency band.

15. The power amplifier according to claim 9, wherein the first part and/or the second part and/or the third part of the output transmission line has higher impedance at the beginning and decreased impedance towards the output port.

16. The power amplifier according to claim 9, wherein the first part and/or the second part and/or the third part of the output transmission line has lower impedance at the beginning and increased impedance towards the output port.

17. The power amplifier according to claim 1, wherein the output transmission line is terminated by a resistive load at a beginning of the output transmission line.

18. The power amplifier according to claim 1, wherein isolators are placed between some parts or each part of the output transmission line.

19. An electronic device comprising a power amplifier according to claim 1.

* * * * *